(12) United States Patent
Bhaskaran et al.

(10) Patent No.: US 8,768,651 B2
(45) Date of Patent: Jul. 1, 2014

(54) SYSTEM AND METHOD FOR AUTOMATIC STANDARDIZATION AND VERIFICATION OF SYSTEM DESIGN REQUIREMENTS

(75) Inventors: Srinivasan Bhaskaran, Bangalore (IN); Raj Kumar Singh, Bangalore (IN); Vishal Narayan, Bangalore (IN); Ramakrishna Katakam, Bangalore (IN); Sumeet Singh Manglotra, Bangalore (IN); Aloke Roy, Bangalore (IN); Clement Monneret, Toulouse (FR)

(73) Assignee: Airbus Engineering Centre India, Bangalore, Karnataka (IN)

( * ) Notice: Subject to any disclaimer, the term of this patent is extended or adjusted under 35 U.S.C. 154(b) by 231 days.

(21) Appl. No.: 12/919,229

(22) PCT Filed: Nov. 9, 2009

(86) PCT No.: PCT/EP2009/064861
§ 371 (c)(1),
(2), (4) Date: Aug. 25, 2010

(87) PCT Pub. No.: WO2010/055017
PCT Pub. Date: May 20, 2010

(65) Prior Publication Data
US 2011/0213757 A1 Sep. 1, 2011

(30) Foreign Application Priority Data
Nov. 11, 2008 (IN) .......................... 2765/CHE/2008

(51) Int. Cl.
*G06F 17/50* (2006.01)
(52) U.S. Cl.
CPC .................................. *G06F 17/50* (2013.01)
USPC .................................. 703/1; 700/97; 345/419

(58) Field of Classification Search
USPC ............ 703/1; 700/95–98, 104; 345/419–420
See application file for complete search history.

(56) References Cited

U.S. PATENT DOCUMENTS

| 6,182,020 B1 | 1/2001 | Fairbanks |
| 6,560,571 B1 | 5/2003 | McBride |
| 2006/0129270 A1* | 6/2006 | Pankl et al. .................... 700/182 |

(Continued)

OTHER PUBLICATIONS

CodeCAD.com, CADWorx Plant, Apr. 30, 2008, 14 pages, retreived on Mar. 22, 2013 from the internet archive, http://web.archive.org/web/20080515000000*/http://www.codecad.com/Pipe.htm.*

(Continued)

*Primary Examiner* — Eunhee Kim
(74) *Attorney, Agent, or Firm* — Prakash Nama; Global IP Services, PLLC

(57) ABSTRACT

A novel automatic standardization and verification process for system design requirements in a product development project is disclosed. In one embodiment, a method for automatic standardization and verification of system design requirements in a product development project using a standardization and verification tool embedded in a computer aided design (CAD) application includes obtaining a desired standardized requirement from a requirements database, retrieving compliance criteria from the standardized requirement, obtaining one or more components associated with the standardized requirement from one or more data sources, and obtaining relevant extracted and derived attributes from the one or more components, associated with the standardized requirement. The method further includes comparing the relevant extracted and derived attributes with the compliance criteria, determining whether the relevant extracted and derived attributes substantially meet the compliance criteria based on the outcome of the comparison, and generating a verification report based on the determination.

21 Claims, 18 Drawing Sheets

(56) References Cited

U.S. PATENT DOCUMENTS

| | | |
|---|---|---|
| 2008/0004843 A1 | 1/2008 | Pozuelo Cabrera |
| 2008/0120070 A1 | 5/2008 | Miller et al. |
| 2008/0126018 A1* | 5/2008 | Lin et al. ............ 703/1 |

OTHER PUBLICATIONS

Zhao et al. "Domain independent shell for DfM and its application to sheet metal forming and injection molding"., Computer-Aided Design 37., 2005 p. 881-898.*

* cited by examiner

STANDARD REQUIREMENT CHILD PANEL 1.3   ? X

VERIFICATION — 1605
● AUTO ○ MANUAL ○ NON-VERIFIABLE

REQUIREMENT TYPE — 1610
POSITION ▾

ENTITY — 1615
EQUIPMENT(S) ▾
PART 3.1 ▾

FIRST REFERENCE ENTITY — 1620
EQUIPMENT(S) ▾
PART 2.1 ▾

SECOND REFERENCE ENTITY — 1625
EQUIPMENT(S) ▾
PART 1.1 ▾

CONDITION — 1630
BETWEEN ▾

STANDARDIZED REQUIREMENT — 1635
THE POSITION OF PART 3.1
SHALL BE LOCATED BETWEEN PART 2.1
AND PART 1.1

SPLIT — 1640

<<   >>
OK   CANCEL

| REQUIREMENTS DOCUMENT 1705 | REQUIREMENT ID 1710 | REQUIREMENT STATEMENT 1715 | REQUIREMENT TYPE 1720 | ENTITIES 1725 | STANDARDIZED REQUIREMENT 1730 | VERIFICATION LOGIC 1735 | CALCULATED VALUES 1740 | INSTALLATION COMPLIANCY 1745 | PROOF OF VERIFICATION 1750 |
|---|---|---|---|---|---|---|---|---|---|
| REQ 1 | REQUIREMENT_1 | EQUIPMENT 1 SHALL BE LOCATED BETWEEN EQUIPMENT 3 AND EQUIPMENT 4 | POSITION | EQUIPMENT 1 EQUIPMENT 2 EQUIPMENT 3 | THE POSITION OF EQUIPMENT 1 SHALL BE LOCATED BETWEEN EQUIPMENT 3 AND EQUIPMENT 4 | (EQUIPMENT 3) < (EQUIPMENT 1) < (EQUIPMENT 4) | (EQUIPMENT 3) = 2451mm (EQUIPMENT 1) = 2600mm (EQUIPMENT 4) = 2724mm | OK | REFER TO PROOF 1 |
| REQ 2 | REQUIREMENT_1 | EQUIPMENT 1 AND EQUIPMENT 2 SHALL BE SEGREGATED BY 2m | ABSOLUTE DISTANCE | EQUIPMENT 1 EQUIPMENT 2 | THE DISTANCE BETWEEN EQUIPMENT 1 AND EQUIPMENT 2 SHALL BE MORE THAN 2m | d(EQUIPMENT 1, EQUIPMENT 2) > 2m | d(EQUIPMENT 1, EQUIPMENT 2) = 2150mm | OK | REFER TO PROOF 2 |

SYSTEM AND METHOD FOR AUTOMATIC STANDARDIZATION AND VERIFICATION OF SYSTEM DESIGN REQUIREMENTS

FIELD OF TECHNOLOGY

The present invention relates generally to standardization and verification of system design requirements in product development projects, and more particularly relates to automatic standardization of system design requirements based on requirement based engineering (RBE) guidelines and final verification of the standardized system design requirements.

BACKGROUND

Large product development projects face the daunting challenge of efficiently meeting continuously increasing and evolving system design requirements, such as legislative/regulatory requirements, customer requirements, knowledgebase requirements and so on. Generally, meeting these requirements can be expensive and can significantly increase development time. Typically, these requirements are verified periodically to comply with the initial intent of a product development process and to improve safety and quality of designs.

Further, documented requirements may not always be expressive enough to convey exact intent of a system designer and this may make the requirements verification very expensive and time consuming. For example, a requirement may state "required length of a conduit shall be minimum". However, the term "minimum" may not be defined enough to perform the requirement verification. Generally, such verification of requirements involves understanding the requirements, manually identifying the associated components, extracting required data from various data sources and manually analyzing the compliance criteria using the extracted data.

Manually tracing the components and requirements associated with the components can be very difficult and time consuming, as there can be a large number of components which go through continuous design changes during the product development phase. Also, such verification of requirements for compliance can be typically an unavoidable obligation, mandated by government agencies and safety requirements. Moreover, the current manual verification process may often result in human error. Thus, current solutions fail to address easy access to all requirements information and easier verification for compliance to these requirements.

SUMMARY

A system and method for automatic standardization and verification of system design requirements is disclosed. According to an aspect of the present invention, a method includes obtaining a desired standardized requirement (e.g., a legislative/regulatory requirement (e.g., a requirement received from one or more different legislative/regulatory authorities), knowledgebase requirement, customer requirement, etc.) from a requirements database using a standardization and verification tool, retrieving compliance criteria from the standardized requirement using the standardization and verification tool, obtaining one or more components associated with the standardized requirement from one or more data sources using the standardization and verification tool, and obtaining relevant extracted and derived attributes from the one or more components, associated with the standardized requirement, using the standardization and verification tool.

Further, the method includes comparing the relevant extracted and derived attributes with the compliance criteria using the standardization and verification tool, determining whether the relevant extracted and derived attributes substantially meet the compliance criteria based on the outcome of the comparison using the standardization and verification tool and generating a verification report based on the determination using the standardization and verification tool. For example, the determining whether the relevant extracted and derived attributes substantially meet the compliance criteria based on the outcome of the comparison using the standardization and verification tool includes determining whether the relevant extracted and derived attributes from each split requirement substantially meet the compliance criteria based on the outcome of the comparison using the standardization and verification tool.

The method may include providing a desired requirement in the requirements database, validating the desired requirement for meeting requirement based engineering (RBE) guidelines using the standardization and verification tool, and validating whether the desired requirement can be used for an automatic verification in the CAD application. Also, the method may include sending the desired requirement back to the standardization and verification tool for standardizing into one or more sub-requirements based on the compliance criteria if the validation fails, and declaring the desired requirement as desired standardized requirement and storing the desired standardized requirement in the requirements database using the standardization and verification tool if the validation passes.

Further, if the validation fails, the method may also include determining whether the desired requirement can be verified using a simulation tool. Furthermore, the method may include using the simulation tool to verify the desired requirement by comparing simulation results with the compliance criteria associated with the desired requirement and to output a verification report, if the desired requirement can be verified using the simulation tool, and manually performing the verification and outputting a verification report if the desired requirement cannot be verified using the simulation tool.

The method may also include analyzing existing requirements and creating a set of requirement types (e.g., absolute length, absolute distance, relative length, absolute diameter, position, relative diameter, etc.), entity types (e.g., equipment, system, harness, route, pipe, etc.) and evaluation conditions (e.g., equal to, at most, between, at least, etc.) based on the compliance criteria. In addition, the method may include determining whether the desired requirement includes multiple compliance criteria using the standardization and verification tool. The method may further include setting a number of splits to one using the standardization and verification tool if there are no multiple compliance criteria, and identifying the number of splits required for the desired requirement and launching a standard requirement child panel using the standardization and verification tool if there are multiple compliance criteria.

Additionally, the method may include selecting one requirement type from the set of requirement types based on a compliance criterion specified in the desired requirement using the standardization and verification tool, selecting one of the entity types associated with the desired requirement using the standardization and verification tool, searching and selecting one or more entities associated with the desired requirement using the standardization and verification tool, selecting one of the evaluation conditions associated with the desired requirement using the standardization and verification tool, and providing at least one of a verification value and a reference associated with the desired requirement to arrive at the desired standardized requirement using the standardization and verification tool.

For example, the searching and selecting one or more entities associated with the desired requirement using the standardization and verification tool includes searching and selecting based on function and geometry based attributes associated with the one or more entities associated with the desired requirement using the standardization and verification tool.

According to another aspect of the present invention, an article includes a storage medium having instructions, that when executed by a computing platform, result in execution of a method for automatic standardization and verification of system design requirements in a product development project using a standardization and verification tool embedded in a CAD application, the method includes obtaining a desired standardized requirement (e.g., legislative/regulatory requirement, knowledgebase requirement, customer requirement, etc.) from a requirements database using the standardization and verification tool, retrieving compliance criteria from the standardized requirement using the standardization and verification tool, obtaining one or more components associated with the standardized requirement from one or more data sources using the standardization and verification tool, and obtaining relevant extracted and derived attributes from the one or more components, associated with the standardized requirement, using the standardization and verification tool.

The method of the storage medium further includes comparing the relevant extracted and derived attributes with the compliance criteria using the standardization and verification tool, determining whether the relevant extracted and derived attributes substantially meet the compliance criteria based on the outcome of the comparison using the standardization verification tool, and generating a verification report based on the determination using the standardization and verification tool.

Further, the storage medium may have instructions to provide a desired requirement in the requirements database, validate the desired requirement for meeting RBE guidelines using the standardization and verification tool, and validate whether the desired requirement can be used for an automatic verification in the CAD application.

Also, the storage medium may have instructions to send the desired requirement back to the standardization and verification tool for standardizing into one or more sub-requirements based on the compliance criteria if the validation fails, and declaring the desired requirement as desired standardized requirement and storing the desired standardized requirement in the requirements database using the standardization and verification tool if the validation passes. Further, if the validation fails, the storage medium may have instructions to determine whether the desired requirement can be verified using a simulation tool.

The storage medium may have instructions to use the simulation tool to verify the desired requirement by comparing simulation results with the compliance criteria associated with the desired requirement and to output a verification report if the desired requirement can be verified using the simulation tool, and to manually perform the verification and output a verification report if the desired requirement cannot be verified using the simulation tool. In addition, the storage medium may have instructions to analyze existing requirements and create a set of requirement types, entity types and evaluation conditions based on the compliance criteria. Also, the storage medium may have instructions to determine whether the desired requirement includes multiple compliance criteria using the standardization and verification tool.

Further, the storage medium may have instructions to set a number of splits to one using the standardization and verification tool if there are no multiple compliance criteria, and identifying the number of splits required for the desired requirement and launching a standard requirement child panel using the standardization and verification tool if there are multiple compliance criteria. Further, the storage medium may have instructions to select one requirement type from the set of requirement types based on a compliance criterion specified in the desired requirement using the standardization and verification tool, to select one of the entity types associated with the desired requirement using the standardization and verification tool, to search and select one or more entities associated with the desired requirement using the standardization and verification tool, to select one of the evaluation conditions associated with the desired requirement using the standardization and verification tool and to provide at least one of a verification value and a reference associated with the desired requirement to arrive at the desired standardized requirement.

According to yet another aspect of the present invention, a system for automatic standardization and verification of system design requirements in a product development project includes a requirements database, one or more data sources, and a standardization and verification tool embedded in a CAD application residing in one or more application servers configured to receive requirement information and component information from the requirements database and the one or more data sources, respectively.

Further, the standardization and verification tool is configured to obtain a desired standardized requirement (e.g., legislative/regulatory requirement, knowledgebase requirement, customer requirement, etc.) from the requirements database. Also, the standardization and verification tool retrieves compliance criteria from the desired standardized requirement. In addition, the standardization and verification tool obtains one or more components associated with the standardized requirement from the one or more data sources and obtains relevant extracted and derived attributes from the one or more components associated with the standardized requirement. The standardization and verification tool then compares the relevant extracted and derived attributes with the compliance criteria and determines whether the relevant extracted and derived attributes substantially meet the compliance criteria based on the outcome of the comparison. In addition, the standardization and verification tool generates a verification report based on the determination.

Furthermore, the standardization and verification tool includes a standard requirement main panel that is configured to provide a desired requirement in the requirements database and validates the desired requirement for meeting RBE guidelines. Additionally, the standardization and verification tool validates whether the desired requirement can be used for an automatic verification in the CAD application. If the validation fails, the standardization and verification tool sends the desired requirement back for standardizing into one or more sub-requirements based on the compliance criteria, and if the validation passes, the standardization and verification tool declares the desired requirement as desired standardized requirement and stores the desired standardized requirement in the requirements database.

Further, if the validation fails, the standardization and verification tool is configured to determine whether the desired requirement can be verified using a simulation tool. If the desired requirement can be verified using the simulation tool, the standardization and verification tool is configured to use the simulation tool to verify the desired requirement by comparing simulation results with the compliance criteria associated with the desired requirement and to output a verification report. If the desired requirement cannot be verified using the simulation tool, the standardization and verification tool is configured to perform a manual verification and output a verification report. In addition, the standardization and verification tool analyzes existing requirements and creates a set of requirement types, entity types, and evaluation conditions based on the compliance criteria.

Furthermore, the standardization and verification tool determines whether the desired requirement includes multiple compliance criteria. If there are no multiple compliance criteria, the standardization and verification tool sets a number of splits to one in the standard requirement main panel. If there are multiple compliance criteria, the standardization and verification tool identifies the number of splits required for the desired requirement and launches a standard requirement child panel.

In addition, the standardization and verification tool selects one requirement type from the set of requirement types based a compliance criterion specified in the desired requirement and selects one of the entity types associated with the desired requirement. Further, the standardization and verification tool searches and selects one or more entities associated with the desired requirement, selects one of the evaluation conditions associated with the desired requirement, and provides at least one of a verification value and a reference associated with the desired requirement to arrive at the desired standardized requirement.

The methods, systems and apparatuses disclosed herein may be implemented in any means for achieving various aspects, and other features will be apparent from the accompanying drawings and from the detailed description that follow.

BRIEF DESCRIPTION OF THE DRAWINGS

Example embodiments are illustrated by way of an example and not limitation in the figures of the accompanying drawings, in which like references indicate similar elements and in which:

FIG. 16 illustrates a screenshot of a standard requirement child panel, with resulting standardized requirement of "position between" compliance, according to an embodiment of the invention;

FIG. 17 illustrates a screenshot of a verification report obtained using the standardization and verification tool, according to an embodiment of the invention.

Other features of the present embodiments will be apparent from the accompanying drawings and from the detailed description that follow.

DETAILED DESCRIPTION

A system and method for automatic standardization and verification of system design requirements in a product development project is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "component" and "entity" are interchangeably used throughout the document. Further, the terms "system design requirement" and "requirement" are interchangeably used throughout the document.

Figure 1:
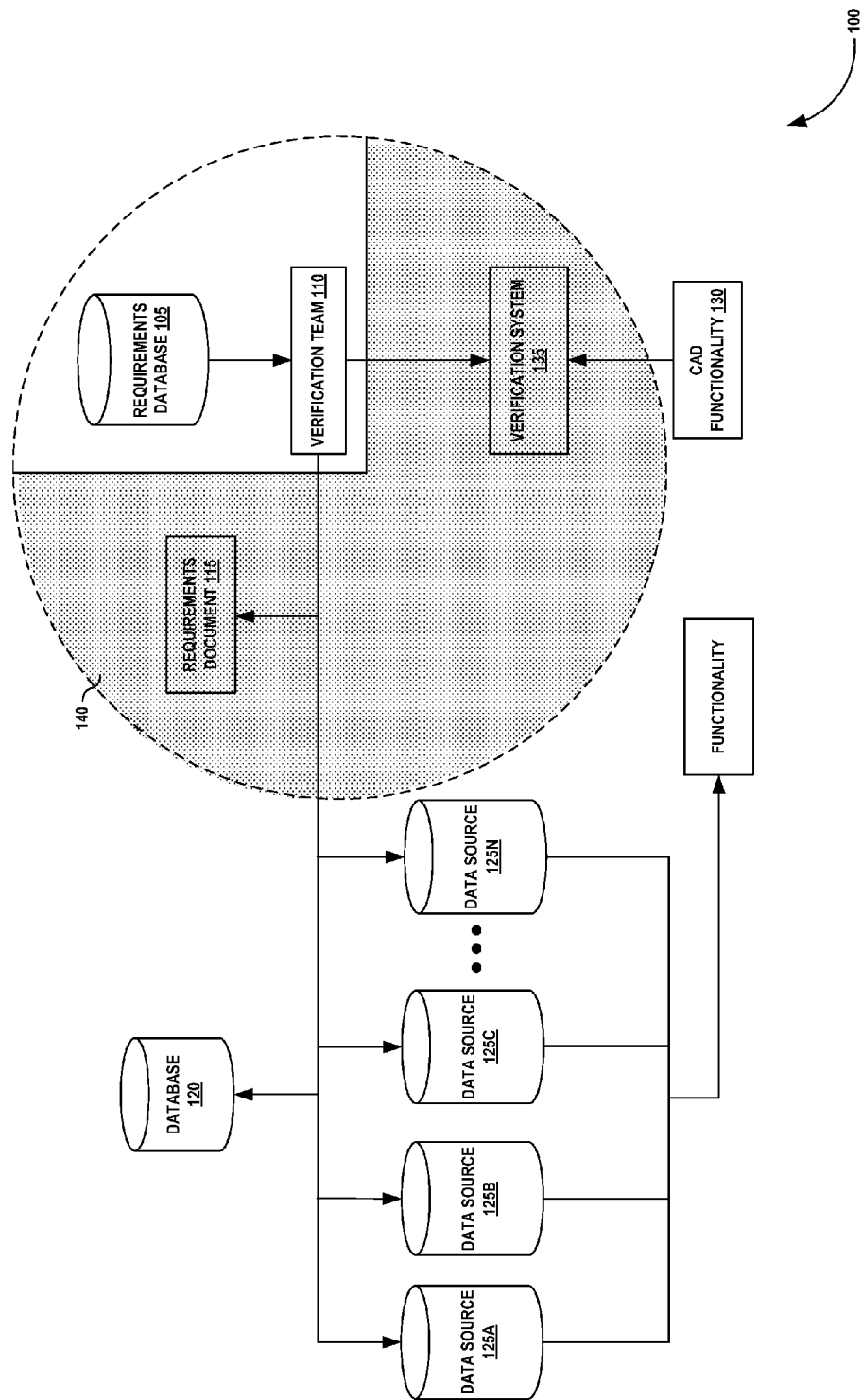
FIG. 1 illustrates a block diagram including major components of a current requirements verification process and their interconnections in the context of the invention.

FIG. 1 illustrates a block diagram 100 including major components of a current requirements verification process and their interconnections in the context of the invention. Particularly, FIG. 1 illustrates a manual process by which verification of system design requirements is performed. As shown in FIG. 1, a verification team 110 obtains one or more desired requirements from a requirements database 105. Typically, the verification team 110 may include a group of individuals (e.g., verification engineers, system designers, system installation engineers and the like) who manually verify the system design requirements. Exemplary one or more desired requirements include legislative/regulatory requirements, customer requirements, knowledgebase requirements and so on.

The verification team 110 then validates each desired requirement. For example, if a desired requirement states "the distance between Part A and Part B shall be minimum". In such a scenario, the term "minimum" is not definite and the verification team 110 has to validate the desired requirement to make it specific, so that verification of the desired requirement can be performed. Further, to make the desired requirement specific, the verification team 110 may have to reach other individuals such as system designers, system installation engineers or have to access various databases.

The verification team 110 then documents the validated desired requirements into a requirements document 115 and stores the requirements document 115 into a database 120. Also, the verification team 110 identifies one or more components associated with each of the desired requirements. Further, the verification team 110 searches the identified one or more components in one or more data sources 125A-N. Furthermore, the verification team 110 checks for functionality of the identified one or more components using a computer aided design (CAD) application.

Moreover, as shown in FIG. 1, using CAD functionality 130, the verification team 110 manually analyzes (i.e., verifies) whether each of the one or more components substantially meet the desired requirement using a verification system 135. Further, the verification team 110 stores results of the verification in the database 120. Since, the above-described verification process is performed manually, the time taken to understand the desired requirements, to manually identify the concerned components, to manually extract the required data and to manually verify the desired requirements (by manually deducing mathematical logic required) can be significantly higher as compared to time taken by an automatic verification process (described below), as illustrated by a shaded area 140 of FIG. 1.

Figure 2:
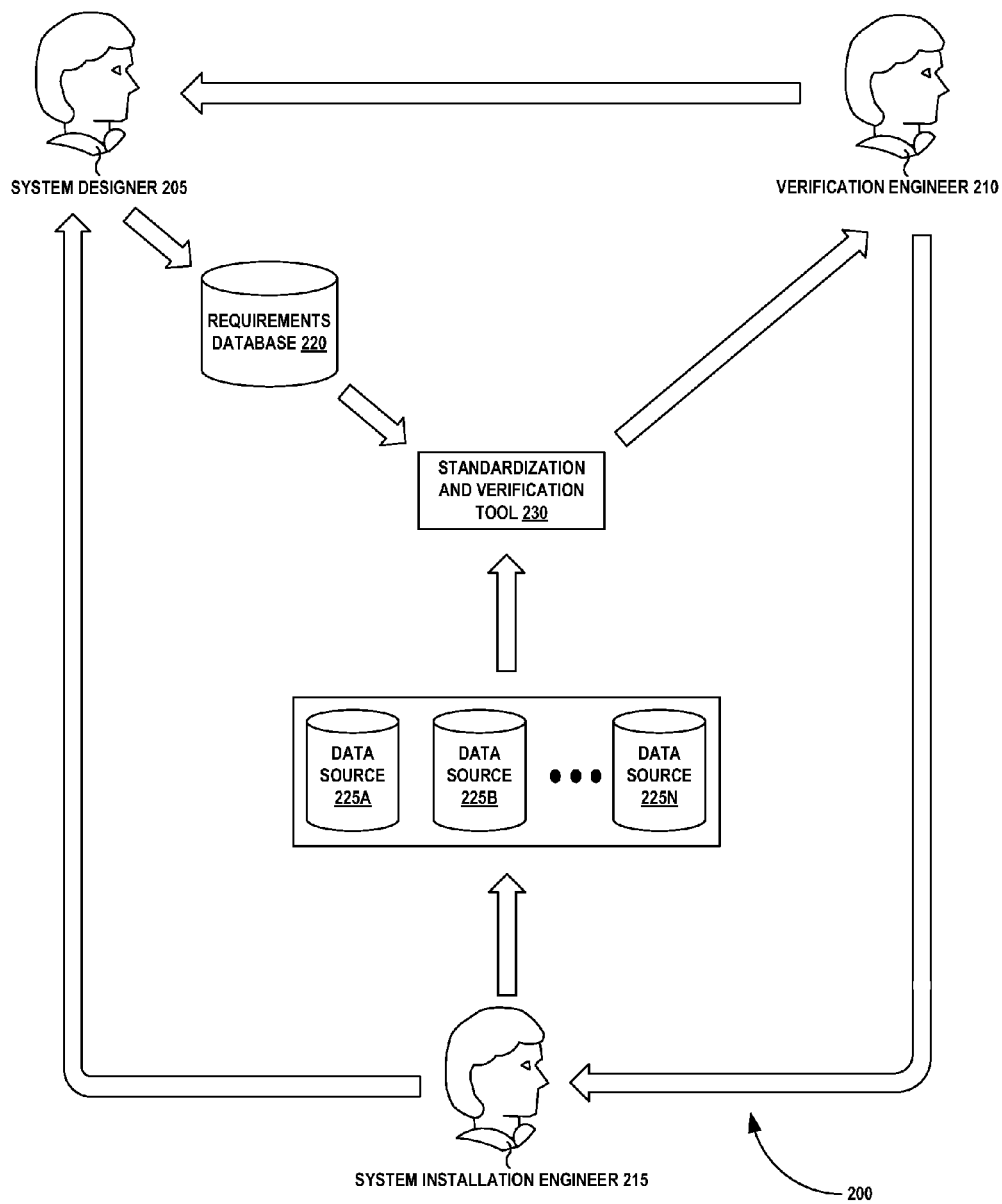
FIG. 2 illustrates a schematic representation of major components of an automatic requirements standardization and verification system and their interconnections with a standardization and verification tool, according to an embodiment of the invention.

FIG. 2 illustrates a schematic representation 200 of major components of an automatic requirements standardization and verification system and their interconnections with a standardization and verification tool 230, according to an embodiment of the invention. Particularly, FIG. 2 shows an interaction between a system designer 205, a verification engineer 210 and a system installation engineer 215 for automatic standardization and verification of system design requirements using the standardization and verification tool 230 (e.g., embedded in a CAD application residing in one or more application servers). Also, FIG. 2 shows a requirements database 220 and one or more data sources 225A-N (e.g., file systems, databases, repositories, etc.) used for obtaining requirement information and component information, respectively.

In the example embodiment illustrated in FIG. 2, the system designer 205 stores a requirements document, including one or more requirements (e.g., legislative/regulatory requirements, customer requirements, knowledgebase requirements, etc.), in the requirements database 220. The standardization and verification tool 230 extracts a desired requirement from the requirements document in the requirements database 220. In some embodiments, the system designer 205 validates the desired requirement for meeting requirement based engineering (RBE) guidelines. Further, the standardization and verification tool 230 standardizes the desired requirement and stores the desired standardized requirement in the requirements database 220.

As shown in FIG. 2, the verification engineer 210 obtains the desired standardized requirement from the requirements database 220 and also obtains one or more components from the one or more data sources 225A-N using the standardization and verification tool 230. In some embodiments, the standardization and verification tool 230 retrieves compliance criteria from the desired standardized requirement and also obtains relevant extracted and derived attributes from the one or more components associated with the desired standardized requirement. In these embodiments, the standardization and verification tool 230 compares the relevant extracted and derived attributes with the compliance criteria and determines whether the relevant extracted and derived attributes substantially meet the compliance criteria.

Further, the standardization and verification tool 230 generates a verification result and visualizes the verification result on a 3D CAD platform. In one exemplary implementation, the verification engineer 210 generates a verification report and stores the verification report along with a proof of verification in the requirements database 220 using the standardization and verification tool 230.

As shown in FIG. 2, the system installation engineer 215 uses design solutions from the one or more data sources 225A-N and the desired standardized requirements from the requirements database 220 for system installation requirement verification. Since, the desired standardized requirements are written following the RBE guidelines, the system installation requirement verification takes less time and cost. Also, this helps improve quality of design.

Figure 3:
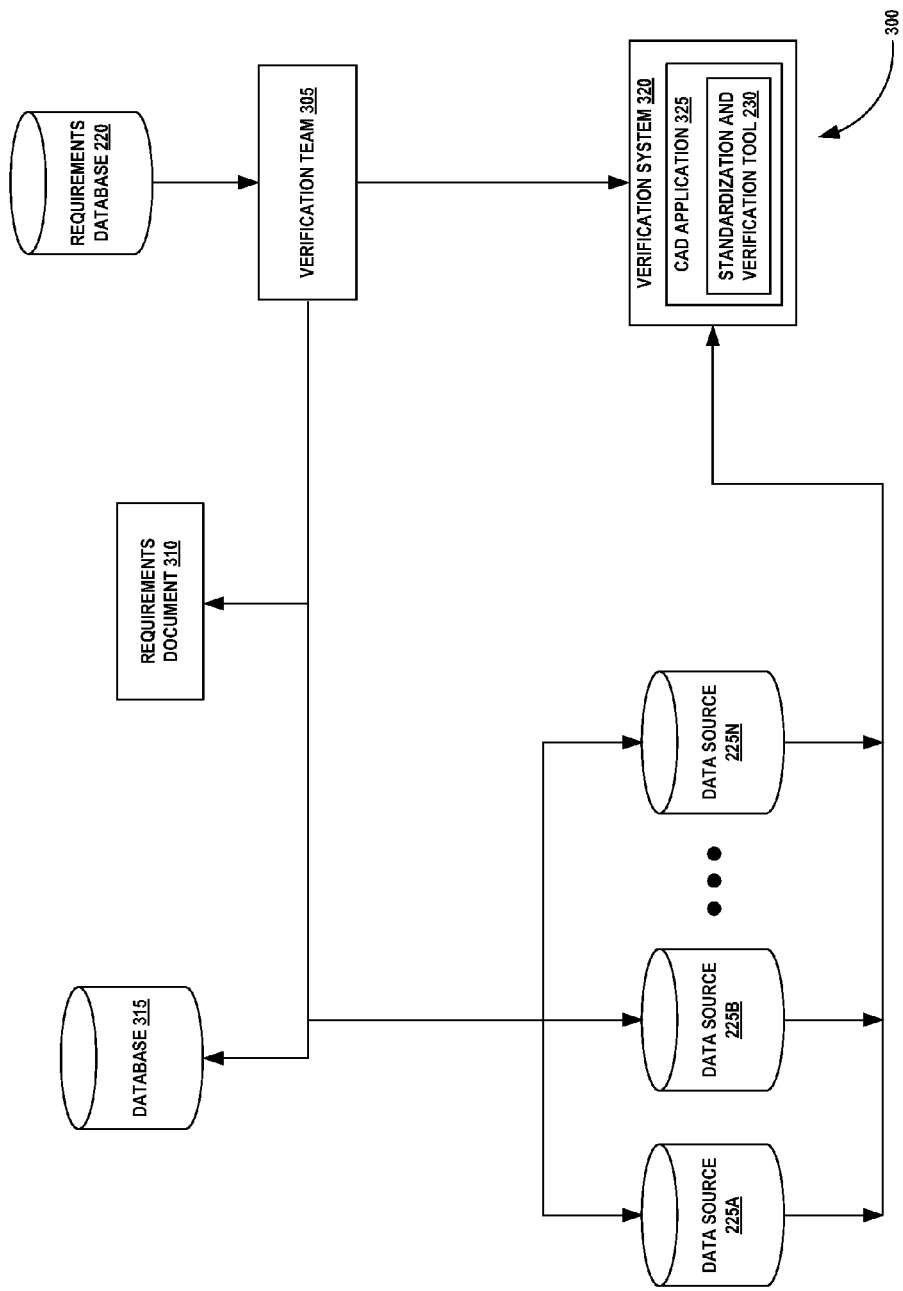
FIG. 3 illustrates a schematic representation of an automatic requirements verification process using the standardization and verification tool, according to an embodiment of the invention.

FIG. 3 illustrates a schematic representation 300 of an automatic requirement verification process using the standardization and verification tool 230, according to an embodiment of the invention. As shown in FIG. 3, a verification system 320 includes a CAD application 325 in which the standardization and verification tool 230 is embedded. In one embodiment, the CAD application 325 may reside in one or more application servers. Further, as shown in FIG. 3, a verification team 305 obtains one or more desired standardized requirements from the requirements database 220. For example, the one or more desired standardized requirements are associated with legislative/regulatory requirements (i.e., a requirement received from one or more different legislative/regulatory authorities), customer requirements and/or knowledgebase requirements.

It is appreciated that the verification team 305 is associated with automatic verification of the one or more desired standardized requirements using the standardization and verification tool 230. The verification team 305 creates a requirements document 310 including the one or more desired standardized requirements obtained from the requirements database 220. In the example embodiment illustrated in FIG. 3, the requirements document 310 including the desired standardized requirement is stored in a database 315. The verification team 305 identifies one or more components associated with one of the desired standardized requirements to be verified. The verification team 305 further obtains the one or more components associated with the desired standardized requirement from the one or more data sources 225A-N.

In some embodiments, the standardization and verification tool 230 retrieves compliance criteria from the desired standardized requirement and also obtains relevant extracted and derived attributes associated with the desired standardized requirement from the one or more components. In these embodiments, the standardization and verification tool 230 determines whether the relevant extracted and derived attributes substantially meet the compliance criteria and generates a verification report based on the determination.

Figure 4:
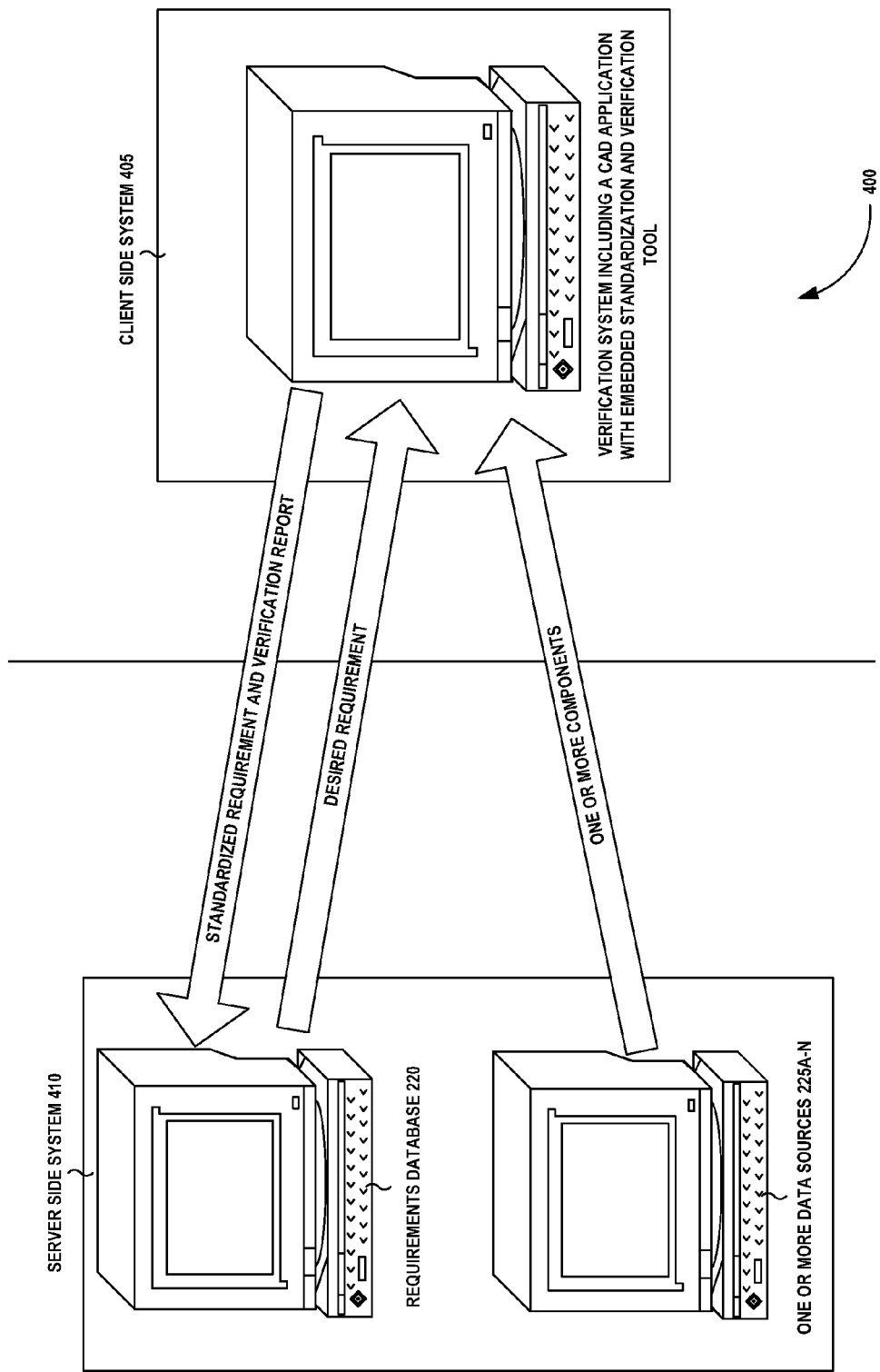
FIG. 4 illustrates a schematic representation of the operation of the standardization and verification tool with the requirements database and the one or more data sources in a networked scenario, according to an embodiment of the invention.

FIG. 4 illustrates a schematic representation 400 of the operation of the standardization and verification tool 230 with the requirements database 220 and the one or more data sources 225A-N in a networked scenario, according to an embodiment of the invention. Particularly, FIG. 4 illustrates a client side system 405 and a server side system 410, both operating in a networked environment. It is appreciated that, the client side system 405 and the server side system 410 enables automatic standardization and verification of system design requirements. In one exemplary implementation, the server side system 410 is remotely located from the client side system 405. As shown in FIG. 4, the client side system 405 includes the verification system 320 including the CAD application 325 with the standardization and verification tool 230 embedded in it. Further, as shown in FIG. 4, the server side system 410 includes the requirements database 220 and the one or more data sources 225A-N.

In operation, the standardization and verification tool 230 embedded in the CAD application 325 is configured to receive requirement information from the requirements database 220 residing in the server side system 410. Also, the standardization and verification tool 230 is configured to receive component information from the one or more data sources 225A-N residing in the server side system 410. In one exemplary implementation, the standardization and verification tool 230 obtains a desired requirement from the requirements database 220. In these embodiments, the standardization and verification tool 230 standardizes the desired requirement (if the desired requirement is automatically verifiable and if the desired requirement meets the RBE guidelines) and stores the desired standardized requirement in the requirements database 220.

In another exemplary implementation, the standardization and verification tool 230 obtains the desired standardized requirement from the requirements database 220 and obtains one or more components associated with the desired standardized requirement from the one or more data sources 225A-N. In some embodiments, the standardization and verification tool 230 obtains relevant extracted and derived attributes associated with the desired standardized requirement from the one or more components. In these embodiments, the standardization and verification tool 230 retrieves compliance criteria from the desired standardized requirement.

Further, the standardization and verification tool 230 compares the relevant extracted and derived attributes with the compliance criteria and determines whether the relevant extracted and derived attributes substantially meet the compliance criteria based on the outcome of comparison. Furthermore, the standardization and verification tool 230 generates a verification report based on the determination and stores the verification report in the requirements database 220 residing in the server side system 410, according to the example embodiment illustrated in FIG. 4.

Figure 5:
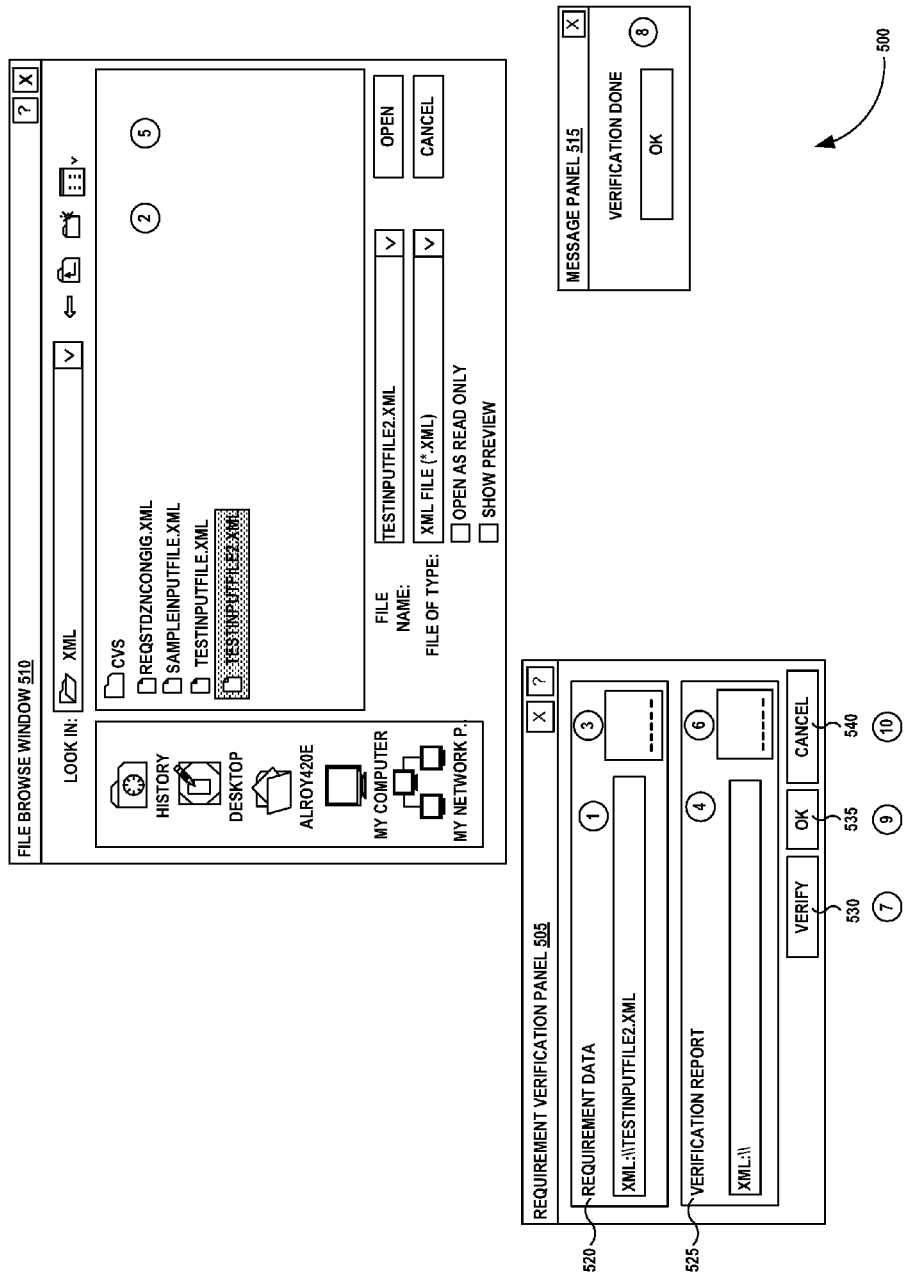
FIG. 5 illustrates a screenshot showing various steps involved in a batch mode interactive verification using a requirement verification panel of the standardization and verification tool, according to an embodiment of the invention.

FIG. 5 illustrates a screenshot 500 showing various steps involved in a batch mode interactive verification using a requirement verification panel 505 of the standardization and verification tool 230, according to an embodiment of the invention. Particularly, FIG. 5 illustrates the requirement verification panel 505, a file browser window 510 and a message panel 515. As shown in FIG. 5, the requirement verification panel 505 includes a requirement data field 520, a verification report field 525, a verify button 530, an OK button 535 and a cancel button 540.

The requirement data field 520 allows a user to specify a file path (e.g., a non-editable file path) associated with a file including a desired standardized requirement(s) for automatic verification of the desired standardized requirement(s). In one embodiment, the user can specify the file path by locating an associated file (e.g., stored at a particular location in the requirements database 220) using a browse button of the requirement data field 520. The verification report field 525 allows the user to specify a file path for storing a verification report (e.g., an output file generated by the standardization and verification tool 230 upon verification) in the requirements database 220. In one embodiment, the user can specify the file path for storing the verification report using a browse button of the verification report field 525.

The verify button 530 enables verifying of the desired standardized requirement(s). Upon verifying the desired standardized requirement(s), a pop-up message is displayed (as illustrated by the message panel 515). The OK button 535 of the requirement verification panel 505 enables the user to generate the verification report and store the verification report to the location specified by the user in the verification report field 525. The cancel button 540 enables the user to cancel a previous action associated with the verification of the desired standardized requirement(s). Further, upon selecting the cancel button 540, the requirement verification panel 505 is closed.

In a typical requirements verification process, FIG. 5 shows the operations 1-10 performed sequentially during verification of the desired requirement. At first, the browse button of the requirement data field 520 is selected to locate a file associated with a desired standardized requirement(s) for verification of the desired standardized requirement (as indicated by operation 1). The file browser window 510 then opens up to facilitate selection of the file associated with the desired standardized requirement(s) and the user selects the associated file (as indicated by operation 2). Upon making the selection of the associated file, the requirement data field 520 displays a non-editable file path associated with the file selected by the user (as indicated by operation 3).

Further, the browse button of the verification report field 525 is selected to specify a file path for storing a verification report upon verification (as indicated by operation 4). The file browser window 510 then opens up to facilitate the user to specify a location (e.g., in the requirements database 220) for storing the verification report (as indicated by operation 5). Upon specifying the location, the verification report field 525 displays a non-editable file path associated with the location specified by the user (as indicated by operation 6).

Operation 7 indicates that upon selection of the verify button 530, the verification of the desired standardized requirement(s) is performed. The message panel 515 then pops up indicating that the verification is complete (as indicated by operation 8). The selection of the OK button 535 may result in generation of the verification report and storing of the verification report to the location specified by the user (as indicated by operation 9). Further, the selection of the cancel button 540 may result in canceling of the previous operation and closing of the requirement verification panel 505 (as indicated by operation 10).

Figure 6:
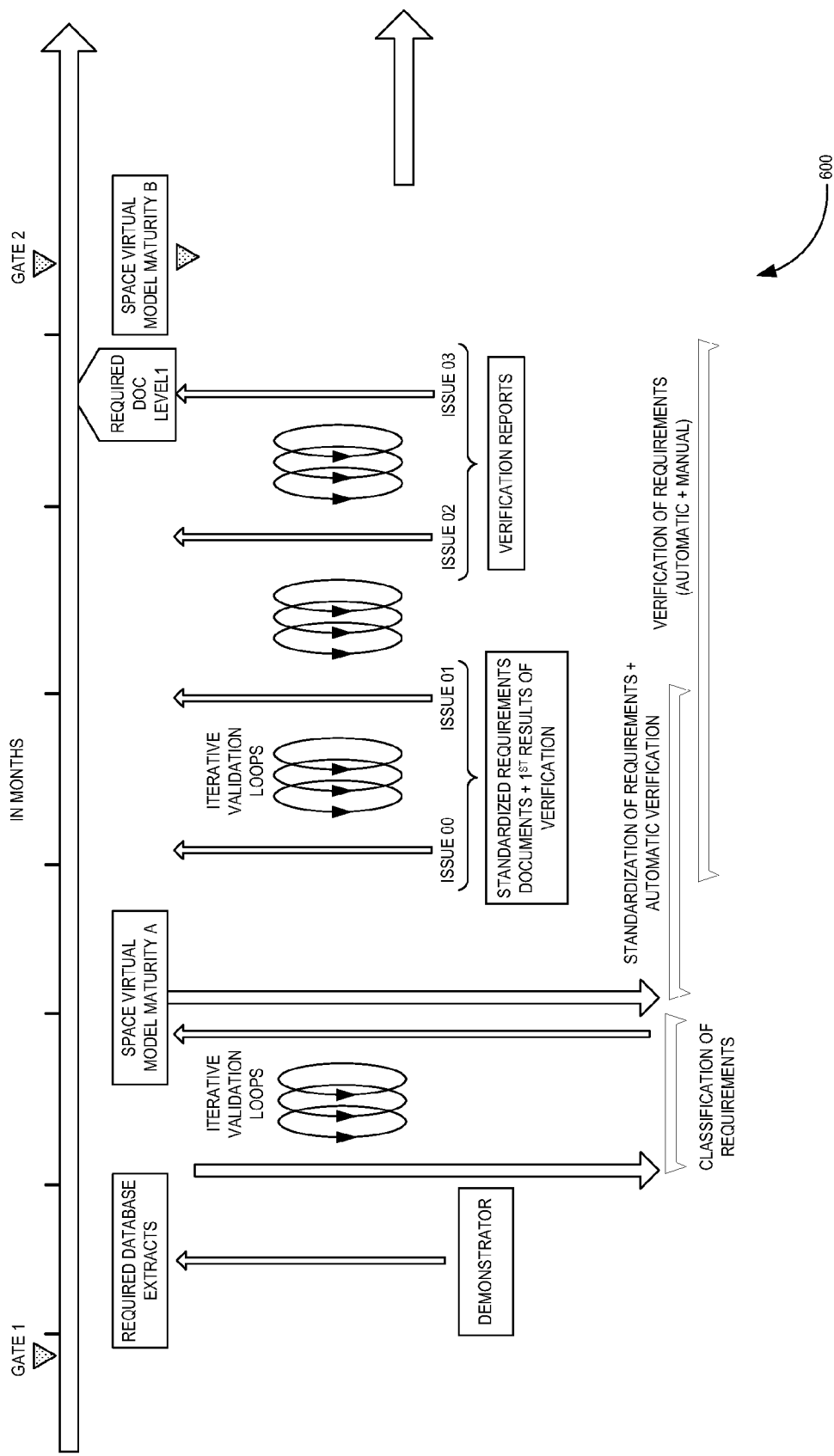
FIG. 6 illustrates a timeline showing usage of the standardization and verification tool at various phases of a product development cycle, according to an embodiment of the invention.

FIG. 6 illustrates a timeline 600 showing usage of the standardization and verification tool 230 at various phases of a product development cycle, according to an embodiment of the invention. Particularly, FIG. 6 illustrates a time period associated with a phase of the product development cycle and an automatic requirement verification process performed using the standardization and verification tool 230. As shown in FIG. 6, gate 1 and gate 2 indicate a start and end of a phase associated with the product development cycle, respectively. Further, as shown in FIG. 6, a space virtual model is having maturity A at the start of the phase (i.e., at the gate 1) and the space virtual model is having maturity B at the end of the phase (i.e., at the gate 2).

It can be seen from FIG. 6 that, the standardization and verification tool 230 can be used to perform the automatic standardization and verification process by running iterative validation loops, anytime during the entire phase of the product development cycle. Also, it can be seen from FIG. 6 that, the iterative validation loops are associated with classification of system design requirements, standardization of the system design requirements and verification of the system design requirements. Further, it is appreciated that the standardization and verification tool 230 is capable of performing automatic standardization and verification of the system design requirements anytime (e.g., as and when a space virtual model is ready or during various stages of maturity of the space virtual model) during the phase of the product development cycle and need not wait until the end of the phase (i.e., upon the space virtual model gaining maturity B at the gate 2) of the product development cycle to complete the verification of the system design requirements as in the current manual verification process. This can help improve the quality of the system design requirements and also maturity of the space virtual model.

In the example embodiment illustrated in FIG. 6, at the gate 1, the requirements database 220 is updated with desired requirements including legislative/regulatory requirements, customer requirements, and/or knowledgebase requirements. These desired requirements are obtained from the requirements database 220 by the standardization and verification tool 230. Further, a first set of iterative validation loops is run by the standardization and verification tool 230, to classify the desired requirements upon obtaining the desired requirements from the requirements database 220.

Further, as shown in FIG. 6, the standardization and verification tool 230 runs multiple sets of iterative validation loops to standardize and verify the system design requirements from the point where the space virtual model is having maturity A till the point where the space virtual model gains maturity B. For example, issue 00, issue 01, issue 02, and issue 03 indicate multiple versions of a standardized requirements document and a verification report obtained by running the multiple sets of iterative validation loops using the standardization and verification tool 230, according to the example embodiment illustrated in FIG. 6. Thus, a complete verification report and a matured requirements document including the standardized requirements are obtained by the time the space virtual model gains maturity B, i.e., at the end of the phase of the product development cycle.

Figure 7:
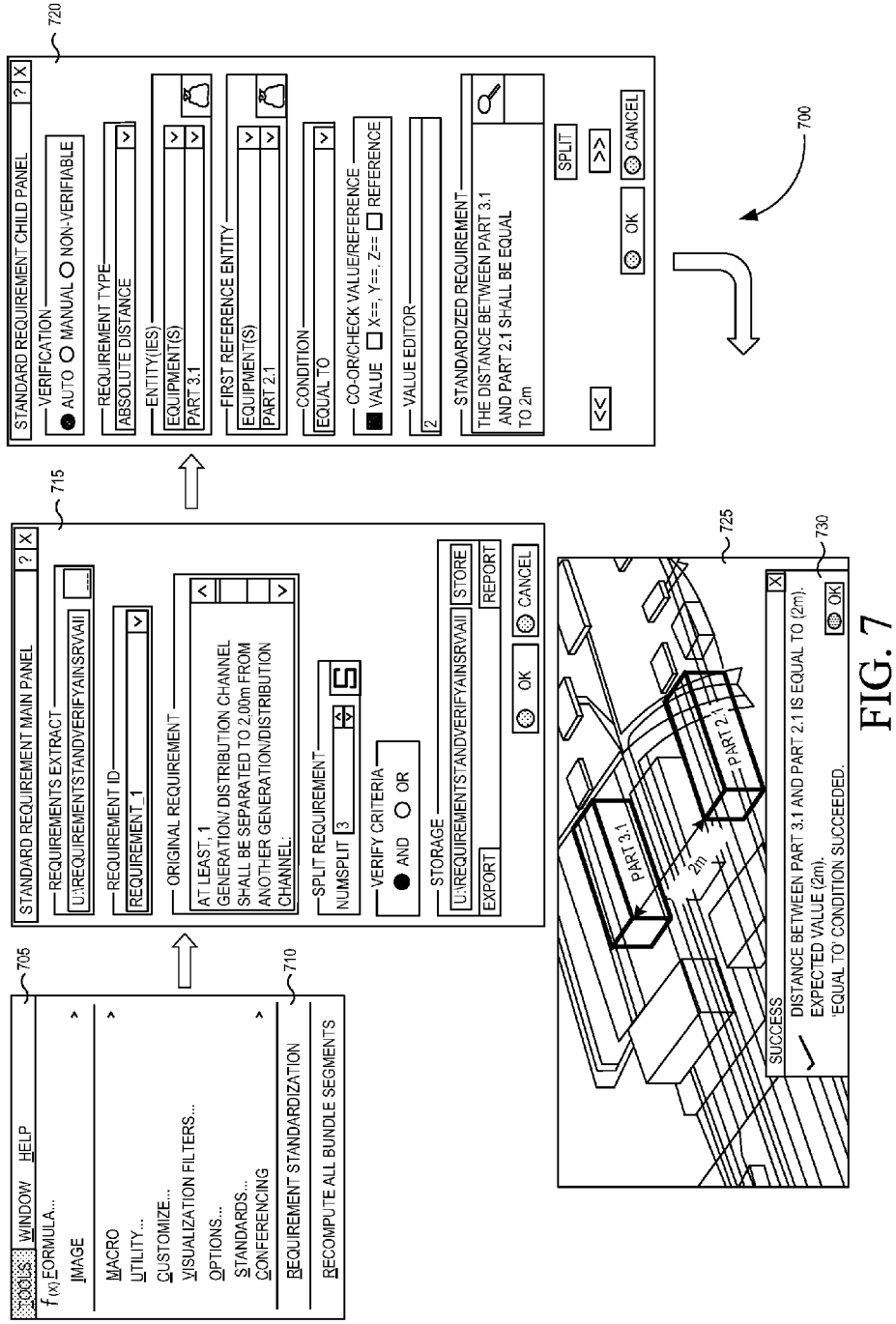
FIG. 7 illustrates a screenshot showing usage of standard requirement panels included in the standardization and verification tool for standardization of a desired requirement and verification result visualization on a 3D computer aided design (CAD) platform, according to an embodiment of the invention.

FIG. 7 illustrates a screenshot 700 showing usage of standard requirement panels included in the standardization and verification tool 230 for standardization of a desired requirement and verification result visualization on a 3D CAD platform 725, according to an embodiment of the invention. Particularly, FIG. 7 illustrates automatic standardization and verification of the desired requirement using the standard requirement main panel 715 and the standard requirement child panel 720 included in the standardization and verification tool 230 embedded in the CAD application 325. Also, FIG. 7 shows visualization of a verification result 730 on the 3D CAD platform 725.

As shown in FIG. 7, the standard requirement main panel 715 is launched when the user selects a requirement standardization tab 710 in a tools menu 705. The standard requirement main panel 715 is configured to obtain a requirements document including a desired requirement (e.g., in an extensible markup language (XML) format) in the requirements database 220. In one embodiment, the standard requirement main panel 715 extracts (e.g., parses) the desired requirement, which is provided in the XML format.

The standard requirement main panel 715 is configured to set a number of splits to one if the desired requirement does not include multiple compliance criteria and to set the number of splits to more than one if the desired requirement includes the multiple compliance criteria. As shown in FIG. 7, the standard requirement child panel 720 is launched using the standard requirement main panel 715 for standardizing the desired requirement. In some embodiments, the standard requirement child panel 720 is configured to validate the desired requirement for meeting the RBE guidelines. In these embodiments, the standard requirement child panel 720 validates whether the desired requirement can be used for an automatically verification in the CAD application 325. In one exemplary implementation, keywords present in the desired requirement are matched with a knowledgebase, which includes lexical and engineering domain dictionaries, to confirm the automatic verifiability of the desired requirement.

If the desired requirement can be used for the automatically verification, the standard requirement child panel 720 is operable for standardizing the desired requirement, declaring the desired requirement as desired standardized requirement and storing the desired standardized requirement in the requirements database 220. In one embodiment, the standard requirement child panel 720 is configured to rephrase the desired requirement as per the RBE guidelines and identify one or more entities associated with the desired requirement to arrive at the desired standardized requirement.

The rephrasing of the desired requirement includes selecting a requirement type from a set of requirement types (e.g., absolute distance, absolute length, position, etc.) based on a compliance criterion specified in the desired requirement, selecting an entity type from entity types (e.g., equipment, harness, pipes, route, system, etc.) associated with the desired requirement, and selecting an evaluation condition from evaluation conditions (e.g., at most, equal to, at least, etc.) associated with the desired requirement.

The rephrasing of the desired requirement further includes providing a verification value or a reference associated with the desired requirement. In the example embodiment illustrated in FIG. 7, if the desired requirement displayed in the standard requirement main panel 715 states "at least, 1 generation/distribution channel shall be separated to 2.00 m from another generation distribution channel:", then, for rephrasing the desired requirement, the user may select the requirement type as "absolute distance", the entity type as "equipment(s)", the evaluation condition as "equal to" as shown in the standard requirement child panel 720 and the verification value as "2".

The identifying of the one or more entities associated with the desired requirement includes searching and selecting, based on function and geometry based attributes, the one or more entities associated with the desired requirement. For example, for "equipment A", the user can search through component information using attribute "part name" with value "equipment A". An exemplary entity search panel used for searching and selecting the one or more entities based on the function and geometry based attributes is described in greater detail in FIGS. 12A and 12B, respectively.

Based on the rephrased desired requirement and the identified one or more entities, a desired standardized requirement is generated and displayed by the standard requirement child panel 720. For example, the desired standardized requirement for the desired requirement mentioned above states "the distance between Part 3.1 and Part 2.1 shall be equal to 2 m". Further, the desired standardized requirement is stored in the requirements database 220 (e.g., in an XML format) along with the one or more entities involved and the automatic verifiability status. Those skilled in the art will appreciate that the desired standardized requirement is generated by the standardization and verification tool 230, based on information provided by the user in the fields of the standard requirement child panel 720 and based on the desired requirement.

Further, upon standardizing the requirement, the standardization and verification tool 230 performs verification of the desired standardized requirement. The verification of the desired standardized requirement includes obtaining the desired standardized requirement from the requirements database 220, retrieving compliance criteria from the desired standardized requirement, obtaining one or more components associated with the desired standardized requirement from the one or more data sources 225A-N, and obtaining relevant extracted and derived attributes associated with the desired standardized requirement from the one or more components.

Furthermore, the standardization and verification tool 230 performs the verification of the desired standardized requirement by comparing the relevant extracted and derived attributes with the compliance criteria, and determining whether the relevant extracted and derived attributes from each split requirement substantially meet the desired standardized requirement based on the outcome of the comparison to arrive at the verification result 730. As shown in FIG. 7, the standardization and verification tool 230 visualizes the verification result 730 on the 3D CAD platform 725.

For example, if the desired standardized requirement states "the distance between Part 3.1 and Part 2.1 shall be equal to 2 m", then the distance between Part 3.1 and Part 2.1 is calculated and verified. If the calculated value is 2 m, then the verification result 730 is visualized as "success", else the verification result 730 is visualized as "failure". In the example embodiment illustrated in FIG. 7, the verification result 730 is visualized by highlighting the associated components on the 3D CAD platform 725. Further, the verification result 730 is displayed on the 3D CAD platform 725 as "distance between Part 3.1 and Part 2.1 is equal to 2 m. Expected value is 2 m. "Equal to" condition succeeded". In one embodiment, the verification result 730 is stored in the requirements database 220 in an XML format. In another embodiment, the verification result 730 is exported back into the requirements database 220 as a verification report (e.g., in an XML format).

In accordance with the above-described embodiments, if the desired requirement cannot be used for the automatic verification, then the standardization and verification tool 230 sends back the desired requirement for standardizing into one or more sub-requirements based on the compliance criteria associated with the desired requirement or determines whether the desired requirement can be verified using a simulation tool (e.g., a computer aided engineering (CAE) application, which may be associated with the CAD application 325). In one embodiment, the standardization and verification tool 230 is configured to use the simulation tool to verify the desired requirement by comparing simulation results with the compliance criteria associated with the desired requirement and to output a verification report if the desired requirement can be verified using the simulation tool. In an alternate embodiment, the standardization and verification tool 230 is configured to perform a manual verification and output a verification report if the desired requirement cannot be verified using the simulation tool. Further, the standard requirement main panel 715 and the standard requirement child panel 720 included in the standardization and verification tool 230, are described in greater detail in FIG. 11 and FIGS. 14-16, respectively.

Figure 8:
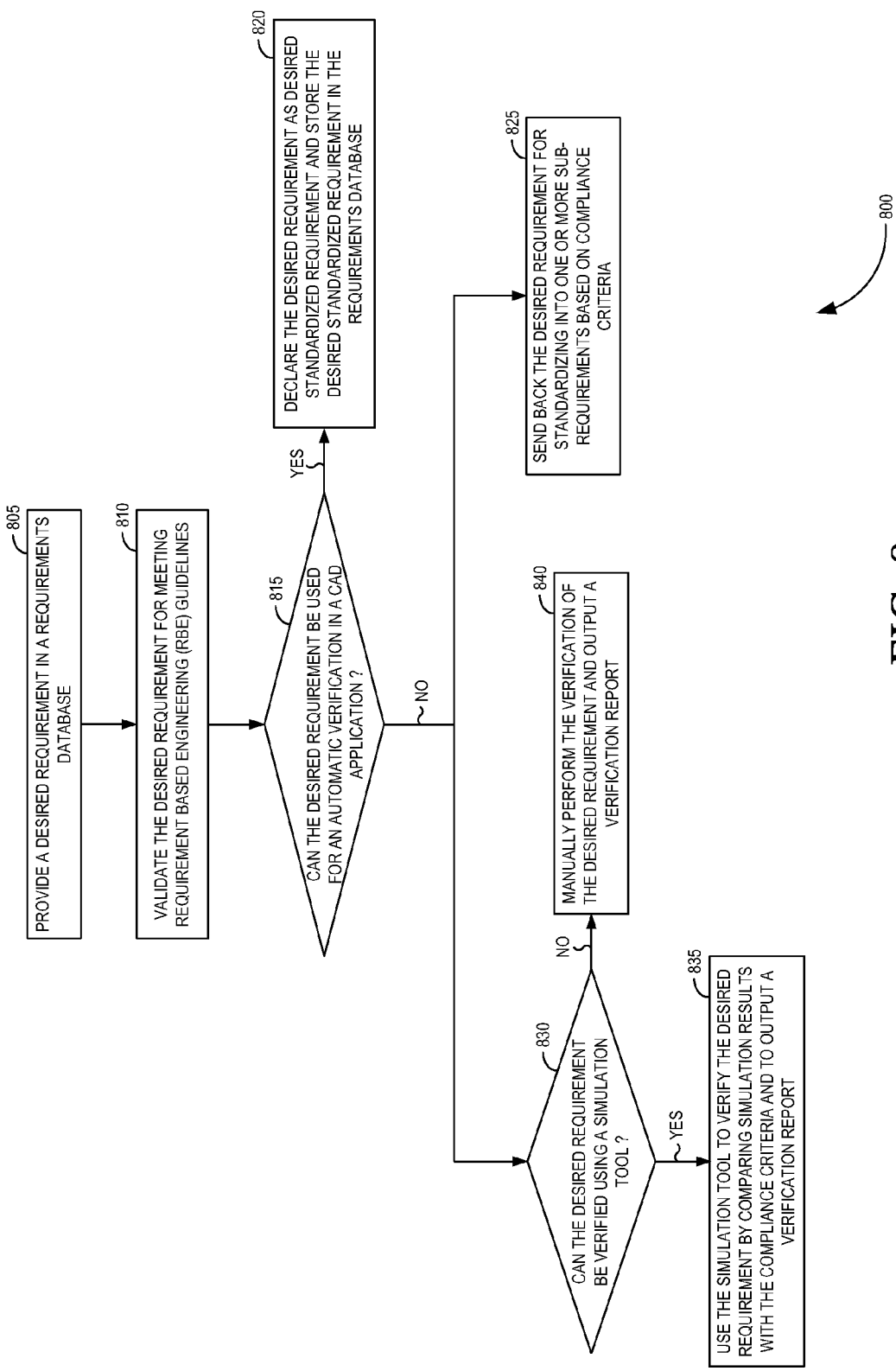
FIG. 8 illustrates a process flowchart of a method of automatic standardization of system design requirements in a product development project using the standardization and verification tool embedded in a CAD application, according to an embodiment of the invention.

FIG. 8 illustrates a process flowchart 800 of a method of automatic standardization of system design requirements in a product development project using a standardization and verification tool (e.g., the standardization and verification tool 230 of FIG. 2) embedded in a CAD application (e.g., the CAD application 325 of FIG. 3), according to an embodiment of the invention. In operation 805, a desired requirement in a requirements database (e.g., the requirements database 220 of FIG. 2) is provided. In one embodiment, the desired requirement is associated with a legislative/regulatory requirement, a knowledgebase requirement and/or a customer requirement. For example, the legislative/regulatory requirement is provided by one or more different legislative/regulatory authorities, the customer requirement is provided by a sales team, and the knowledgebase requirement is provided by a system designer. In operation 810, the desired requirement is validated for meeting RBE guidelines. In operation 815, it is validated whether the desired requirement can be used for an automatic verification in the CAD application 325.

If the validation passes, the process 800 performs operation 820. In operation 820, the desired requirement is declared as desired standardized requirement and the desired standardized requirement is stored in the requirements database 220. In one embodiment, if the validation fails, the process 800 performs operation 825. In an alternate embodiment, if the validation fails, the process 800 performs operation 830. In operation 825, the desired requirement is sent back to the standardization and verification tool 230 for standardizing into one or more sub-requirements based on compliance criteria specified in the desired requirement.

In operation 830, it is determined whether the desired requirement can be verified using a simulation tool. If it is determined that the desired requirement can be verified using the simulation tool then the process 800 performs operation 835, else the process 800 performs operation 840. In operation 835, the simulation tool is used to verify the desired requirement by comparing simulation results with the compliance criteria associated with the desired requirement and output a verification report. In operation 840, the verification of the desired requirement is performed manually and a verification report is outputted.

Figure 9:
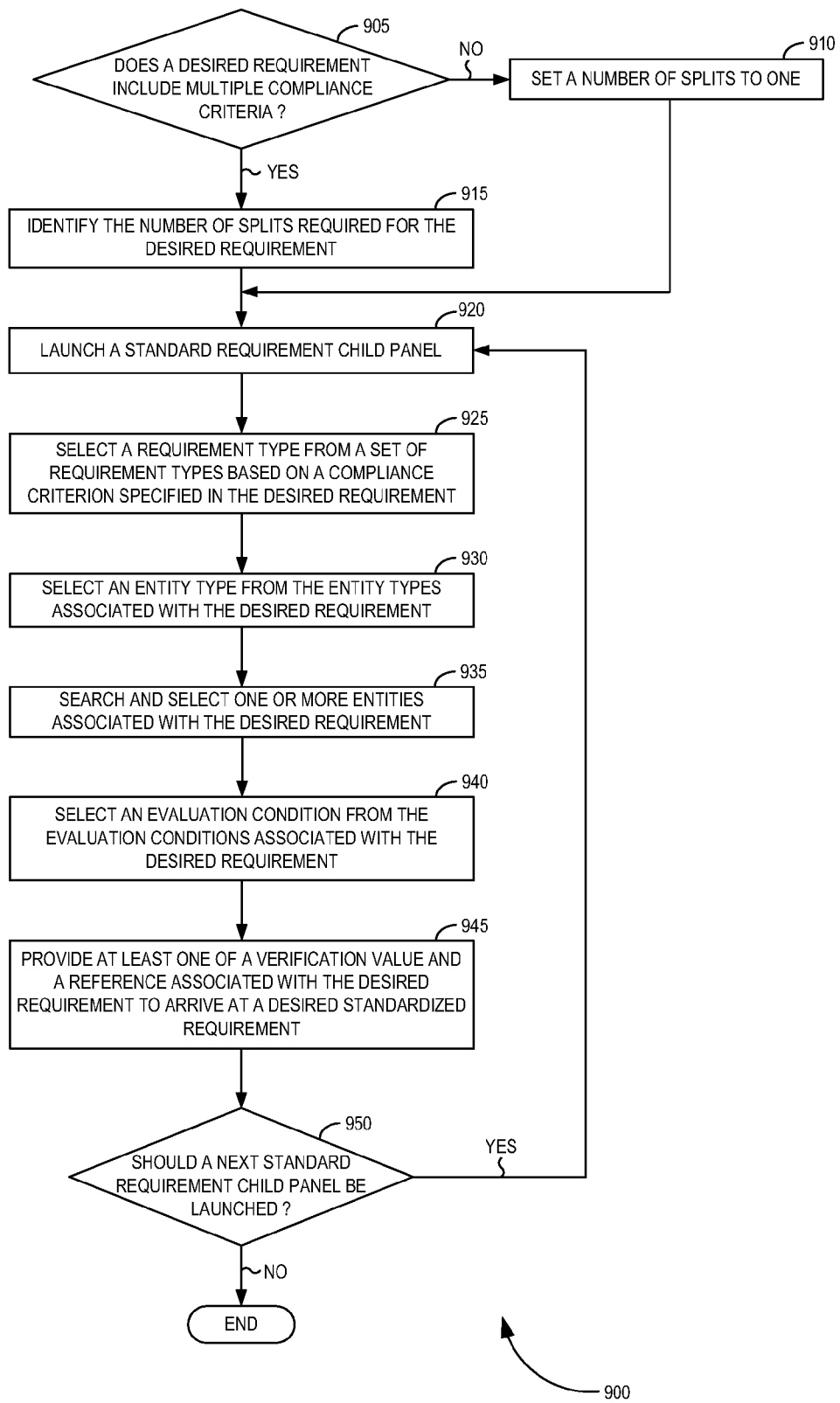
FIG. 9 illustrates a process flowchart of a method of using the standardization and verification tool to arrive at a desired standardized requirement, according to an embodiment of the invention.

FIG. 9 illustrates a process flowchart 900 of a method of using a standardization and verification tool (e.g., the standardization and verification tool 230 of FIG. 2) to arrive at a desired standardized requirement, according to an embodiment of the invention. In one embodiment, the process 900 describes the operation 820 shown in FIG. 8 in more detail using operations 905-950. In operation 905, it is determined whether the desired requirement includes multiple compliance criteria. If it is determined that the desired requirement does not include the multiple compliance criteria, then the process 900 performs operation 910, else the process 900 performs operation 915. In operation 910, a number of splits is set to one. In operation 915, the number of splits required for the desired requirement is identified. In one exemplary implementation, the process 900 goes to operation 920, upon performing either operation 910 or operation 915. In operation 920, a standard requirement child panel is launched.

In operation 925, a requirement type is selected from a set of requirement types (e.g., the set of requirement types 1305 of FIG. 13) based on a compliance criterion specified in the desired requirement. For example, the set of requirement types associated with the desired requirement includes absolute length, relative length, absolute distance, absolute diameter, relative diameter, position and the like. In operation 930, an entity type is selected from entity types (e.g., the entity types 1310 of FIG. 13) associated with the desired requirement. For example, the entity types associated with the desired requirement include equipment, system, harness, route, pipe, and the like. In operation 935, one or more entities associated with the desired requirement are searched and selected. In some embodiments, the one or more entities associated with the desired requirement are searched and selected based on function and geometry based attributes.

In operation 940, an evaluation condition is selected from evaluation conditions (e.g., the evaluation conditions 1315 of FIG. 13) associated with the desired requirement. For example, the evaluation conditions associated with the desired requirement include equal to, at most, between, at least and the like. In operation 945, a verification value or a reference associated with the desired requirement is provided to arrive at a desired standardized requirement. In accordance with the above-described embodiments, existing requirements are analyzed and the set of requirement types, the entity types and the evaluation conditions are created based on the compliance criteria specified in the desired requirement. In operation 950, it is determined whether a next standard requirement child panel is to be launched. If the determination made in operation 950 is true, the process 900 goes to operation 920 and performs operations 920-950, else the process 900 is terminated.

Figure 10:
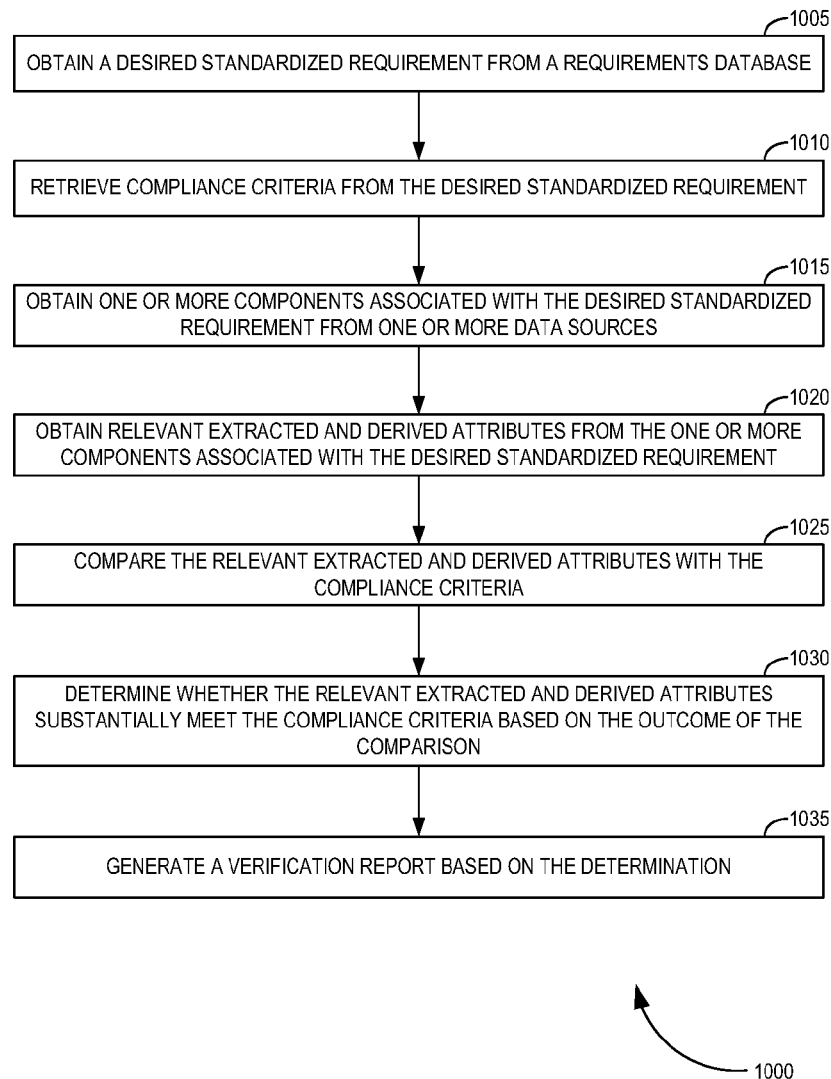
FIG. 10 illustrates a process flowchart of a method of automatic verification of the system design requirements in the product development project using the standardization and verification tool embedded in the CAD application, according to an embodiment of the invention.

FIG. 10 illustrates a process flowchart 1000 of a method of automatic verification of system design requirements in a product development project using a standardization and verification tool (e.g., the standardization and verification tool 230 of FIG. 2) embedded in a CAD application (e.g., the CAD application 325 in FIG. 3), according to an embodiment of the invention. In operation 1005, a desired standardized requirement is obtained from a requirements database 220. In some embodiments, the desired standardized requirement includes a legislative/regulatory requirement, a knowledge-base requirement and/or a customer requirement. In these embodiments, the legislative/regulatory requirement includes a requirement received from one or more different legislative/regulatory authorities.

In operation 1010, compliance criteria specified in the desired standardized requirement are retrieved from the desired standardized requirement. In operation 1015, one or more components associated with the desired standardized requirement are obtained from one or more data sources (e.g., the one or more data sources 225A-N of FIG. 2). In operation 1020, relevant extracted and derived attributes associated with the desired standardized requirement are obtained from the one or more components.

In operation 1025, the relevant extracted and derived attributes are compared with the compliance criteria. In operation 1030, it is determined whether the relevant extracted and derived attributes substantially meet the compliance criteria based on the outcome of the comparison. In some embodiments, it is determined whether the relevant extracted and derived attributes from each split requirement substantially meet the compliance criteria based on the outcome of the comparison. In operation 1035, a verification report is generated based on the determination.

Figure 11:
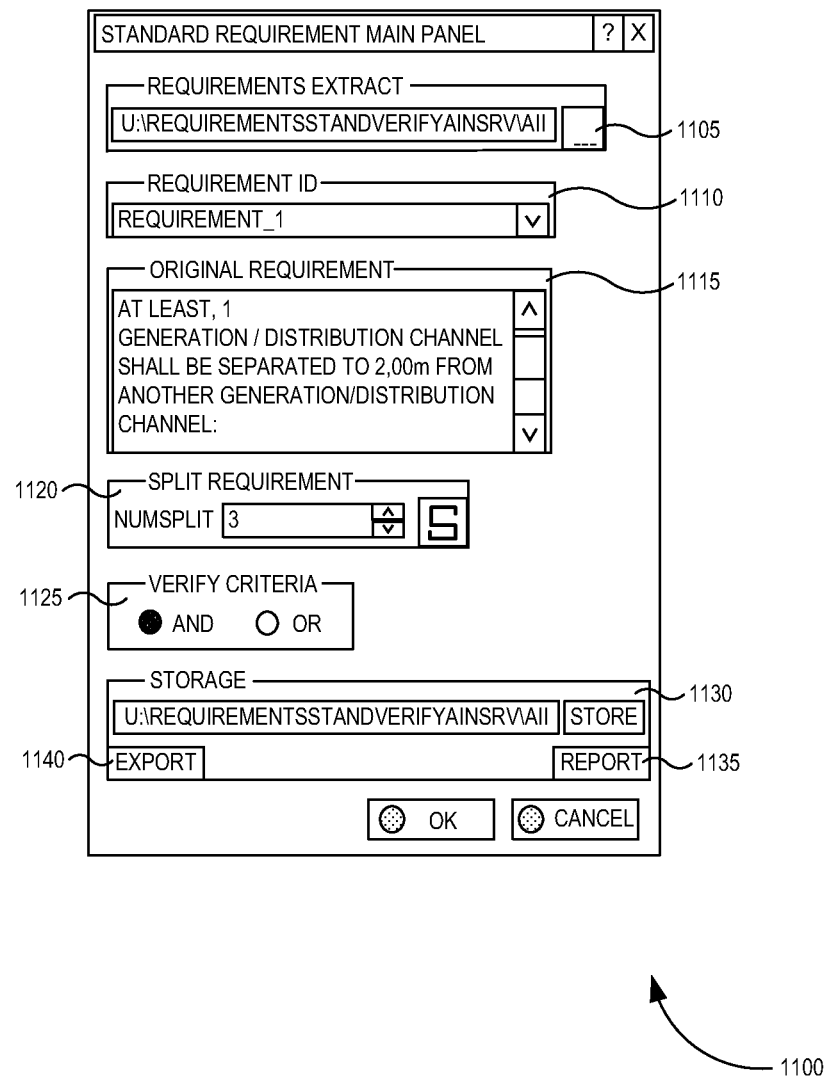
FIG. 11 illustrates a screenshot of a standard requirement main panel of the standardization and verification tool used for splitting a desired requirement which addresses multiple compliance criteria, according to an embodiment of the invention.

FIG. 11 illustrates a screenshot of a standard requirement main panel 1100 of the standardization and verification tool 230 used for splitting a desired requirement which addresses multiple compliance criteria, according to an embodiment of the invention. It is appreciated that the standard requirement main panel 1100 is an exemplary embodiment of the standard requirement main panel 715 of FIG. 7. As shown in FIG. 11, the standard requirement main panel 1100 includes a requirements extract field 1105, a requirement identifier (ID) field 1110, an original requirement field 1115, a split requirement field 1120, a verify criteria field 1125, a storage field 1130, a report button 1135 and an export button 1140.

The requirements extract field 1105 allows the user to select a file path associated with a requirements document (e.g., stored in the requirements database 220). In the example embodiment illustrated in FIG. 11, the selection of the file path associated with the requirements document is enabled via a browse button. In one embodiment, the requirements document includes one or more desired requirements. For example, format of the requirements document may be an XML format. The requirement ID field 1110 provides an option to select a requirement ID associated with one of the desired requirements. It should be noted that each requirement is associated with a requirement ID. The original requirement field 1115 displays the desired requirement associated with the requirement ID. In some embodiments, the standardization and verification tool 230 extracts the desired requirement from the requirements document in the XML format.

The split requirement field 1120 enables setting a number of splits required for the desired requirement (displayed in the original requirement field 1115). In some embodiments, the standardization and verification tool 230 sets the number of splits upon determining whether the desired requirement includes multiple compliance criteria. In one embodiment, the standardization and verification tool 230 sets the number of splits to one when there are no multiple compliance criteria. In an alternate embodiment, the standardization and verification tool 230 sets the number of splits to a value greater than one upon identifying the number of splits required for the desired requirement. As shown in FIG. 11, the split requirement field 1120 provides a split button which enables the user to launch a standard requirement child panel (e.g., the standard requirement child panel 720 of FIG. 7). Further, the standard requirement child panel associated with a desired requirement including multiple compliance criteria is described in greater detail with respect to FIGS. 14, 15 and 16.

The verify criteria field 1125 provides an option to select verification criteria when the desired requirement includes multiple compliance criteria, i.e., when the number of splits set in the split requirement field 1120 is more than one. As shown in FIG. 11, the verification criteria may be based on "and" and "or" operators. For example, when the verification of a desired standardized requirement is to be performed in combination, then the "and" operator is selected as the verification criteria. Alternatively, the "or" operator is selected as the verification criteria, when the verification of the desired standardized requirement is to be performed individually.

In one embodiment, the storage field 1130 enables storing (e.g., using a store button) of the desired standardized requirement (e.g., in an XML format) in the requirements database 220. In another embodiment, the storage field 1130 enables storing (e.g., using a store button) of a verification report in the requirements database 220. It should be noted that the verification report is generated and stored upon standardizing of the desired requirement based on the RBE guidelines and verification of the desired standardized requirement. In one exemplary implementation, the desired requirement is standardized and verified using the standard requirement child panel. For example, the verification report is stored in the requirements database 220 in an XML format. The report button 1135 enables generation of the verification report. In one embodiment, the verification report is generated in the XML format. The export button 1140 enables exporting of a verification result back into the requirements database 220 as a verification report.

In the example embodiment illustrated in FIG. 11, the requirement ID field 1110 displays the requirement ID associated with the desired requirement as "requirement 1". For example, the requirement ID can be selected by the user using a drop down box. Further, the original requirement field 1115 displays the desired requirement as "at least, 1 generation/distribution channel shall be separated to 2.00 m from another generation/distribution channel:". Furthermore, the split requirement field 1120 displays the number of splits required for the desired requirement in the original requirement field 1115 as "3". The verify criteria field 1125 displays the verification criteria selected based on the number of splits as "and". In the example embodiment illustrated in FIG. 11, the verification criteria can be selected by pressing a radio button.

Figure 12A:
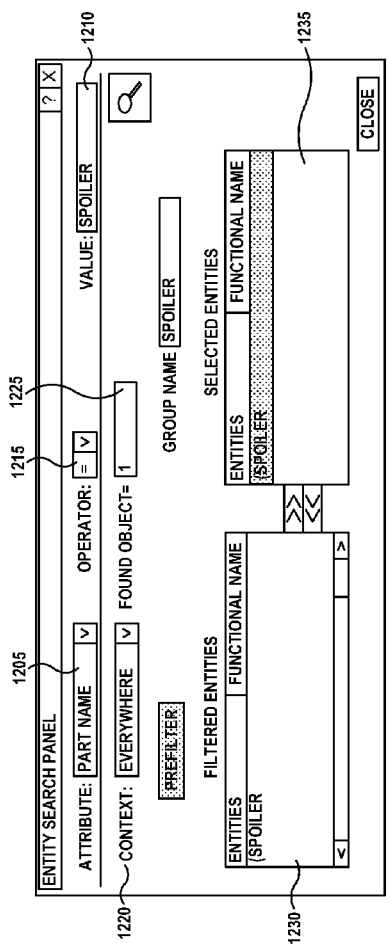
FIGS. 12A and 12B illustrate screenshots of an entity search panel of the standardization and verification tool used for attribute based search of entities residing in one or more data sources associated with a desired requirement, according to an embodiment of the invention.
Figure 12B:
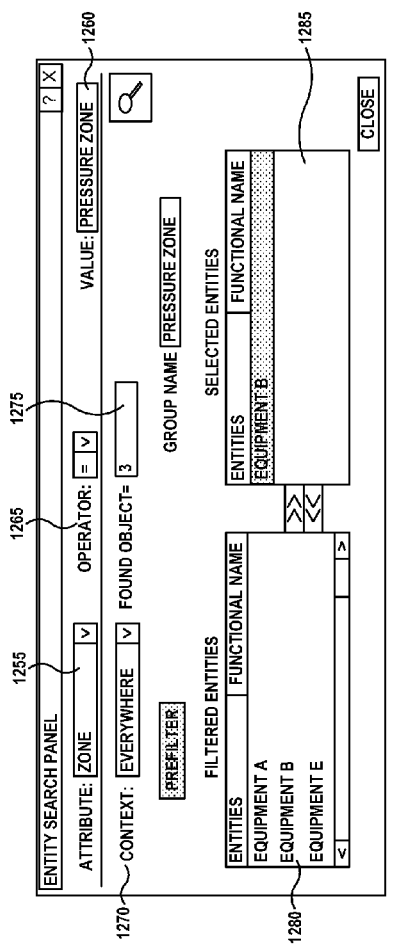

FIGS. 12A and 12B illustrate screenshots of an entity search panel of the standardization and verification tool 230 used for attribute based search of entities residing in the one or more data sources 225A-N associated with the desired requirement, according to an embodiment of the invention. Particularly, FIG. 12A illustrates the screenshot of an entity search panel 1200 used for a function based attribute search of entities associated with the desired requirement from the one or more data sources 225A-N and FIG. 12B illustrates the screenshot of another entity search panel 1250 used for a geometry based attribute search of entities associated with the desired requirement from the one or more data sources 225A-N.

As shown in FIG. 12A, the entity search panel 1200 includes an attribute field 1205, a value field 1210, an operator field 1215, a context field 1220, a found object field 1225, a filtered entities field 1230 and a selected entities field 1235. The attribute field 1205 allows the user to search one or more entities based on a function based attribute (e.g., "part name") associated with the one or more entities. The value field 1210 allows the user to provide a value (e.g., "spoiler") associated with the one or more entities. The operator field 1215 enables the user to filter the search based on an operator set by the user. For example, the operator field 1215 compares the value in the attribute field 1205 with the value in the value field 1210 based on the operator set by the user. For example, the operator may include mathematical functions, such as "=", "≠", etc. The context field 1220 provides an option to restrict the search result based on a context. For example, the context may be based on searching the one or more entities from all data sources or from selected data sources.

The found object field 1225 displays a number of entities found based on the search criteria (i.e., function based attribute, value, operator and context) entered by the user. The filtered entities field 1230 displays one or more entities found by the standardization and verification tool 230 based on the search criteria. The selected entities field 1235 displays one or more entities associated with the desired requirement which are selected by the user from the one or more entities displayed in the filtered entities field 1230. In one embodiment, the entity search panel 1200 allows the user to remove the selected one or more entities from the selected entities field 1235. The searched and selected one or more entities associated with the desired requirement are displayed in an entity field in a standard requirement child panel (e.g., the standard requirement child panel 720 of in FIG. 7). It is appreciated that the selected one or more entities associated with the desired requirement are associated with entity types. For example, the entity types may include equipment(s), harness(es), system(s), route(s), pipe(s) and the like.

In the example embodiment illustrated in FIG. 12A, the attributes field 1205 displays the function based attribute as "part name", the value field 1210 displays the value as "spoiler" and the operator field 1215 displays the operator as "=". Further, the context field 1220 displays the context of search as "everywhere". Based the above search criteria, the entity search panel 1200 displays the number of entities found as "1" in the found object field 1225. Also, the entity search panel 1200 displays the entity found as "spoiler" in the filtered entities field 1230. The selected entities field 1235 displays the entity selected by the user as "spoiler".

Referring to FIG. 12B, the entity search panel 1250 includes an attribute field 1255, a value field 1260, an operator field 1265, a context field 1270, a found object field 1275, a filtered entities field 1280 and a selected entities field 1285. The value field 1260, the operator field 1265, the context field 1270, the found object field 1275, the filtered entities field 1280 and the selected entities field 1285 are same as those described in FIG. 12A except the attribute field 1255 in FIG. 12B which indicates a geometry based attribute (e.g., zone) for searching one or more entities.

In the example embodiment illustrated in FIG. 12B, the attributes field 1255 displays the geometry based attribute as "zone", the value field 1260 displays the value as "pressure zone" and the operator field 1265 displays the operator as "=". Further, the context field 1270 displays the context of search as "everywhere". Based the above search criteria, the entity search panel 1250 displays the number of entities found as "3" in the found object field 1275. Also, the entity search panel 1250 displays the entities found as "equipment A", "equipment B" and "equipment E" in the filtered entities field 1280. Further, the selected entities field 1285 displays the entity selected by the user as "equipment B".

Figure 13:
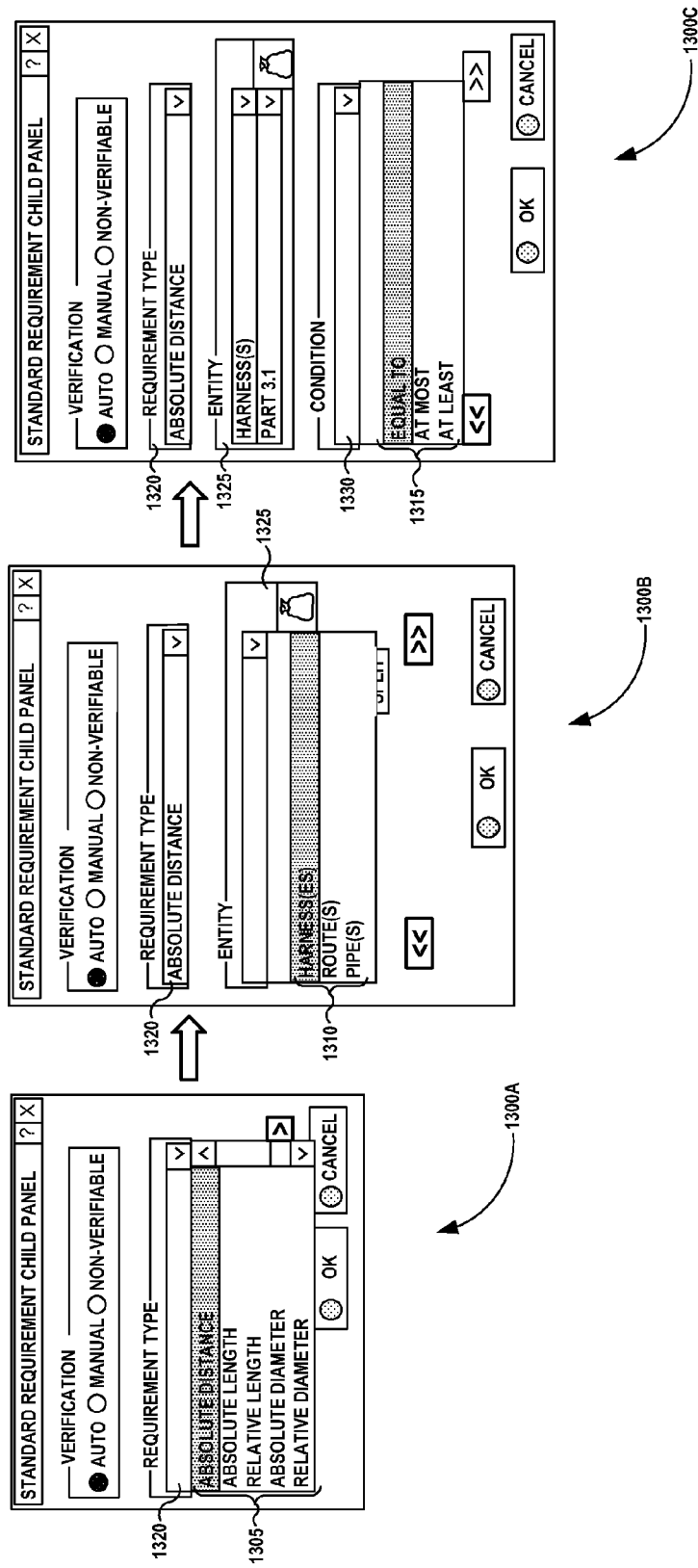
FIG. 13 illustrates a screenshot of a standard requirement child panel of the standardization and verification tool, used for standardizing a desired requirement through a step by step process, according to an embodiment of the invention.

FIG. 13 illustrates a screenshot of a standard requirement child panel of the standardization and verification tool 230, used for standardizing a desired requirement through a step by step process, according to an embodiment of the invention. Particularly, a screenshot 1300A shows a step of selecting a requirement type associated with the desired requirement from a set of requirement types 1305, a screenshot 1300B shows a step of selecting an entity type associated with the desired requirement from entity types 1310 and a screenshot 1300C shows a step of selecting an evaluation condition associated with the desired requirement from evaluation conditions 1315.

In some embodiments, the set of requirement types 1305, the entity types 1310 and the evaluation conditions 1315 are created based on compliance criteria specified in the desired requirement upon analyzing existing requirements. In one embodiment, the screenshots 1300A-C show various steps involved in rephrasing the desired requirement based on the RBE guidelines. As a first step, a requirement type associated with the desired requirement is selected from the set of requirement types 1305 based on a compliance criterion specified in the desired document (as shown in the screenshot 1300A). Further, an entity type associated with the desired requirement is selected from the entity types 1310, as a second step (as shown in the screenshot 1300B). It is appreciated that the entity types 1310 associated with the desired requirement are populated based on the selected requirement type.

In some embodiments, the user may search and select an entity associated with the selected entity type using an entity search panel (e.g., the entity search panel 1200 of FIG. 12A) of the standardization and verification tool 230. Further, an evaluation condition associated with the desired requirement is selected from the evaluation conditions 1315, as a third step. It is appreciated that the evaluation conditions 1315 associated with the desired requirement are populated (as shown in the screenshot 1300C) based on the selected entity type. For example, if the desired requirement states "equipment A shall be installed at 4.8 m from equipment B". The user may select the requirement type as "absolute distance", the entity type as "equipment" and the evaluation condition as "equal to".

In the example embodiment illustrated in FIG. 13, the set of requirement types 1305 as shown in the screenshot 1300A includes "absolute distance", "absolute length", "relative length", "absolute diameter", and "relative diameter". The selected requirement type displayed in a requirement field 1320 is "absolute distance". Further, the entity types 1310 as shown in the screenshot 1300B includes "harness(es)", "route(s)" and "pipe(s)" whereas, the selected entity type displayed in an entity field 1325 is "harness(es)".

Also, the entity displayed in the entity field 1325 is "Part 3.1". Further, the evaluation conditions 1315 as shown in the screenshot 1300C includes "equal to", "at most" and "at least". The evaluation condition selected from the evaluation conditions 1315 is displayed in a condition field 1330 (not shown).

Figure 14:
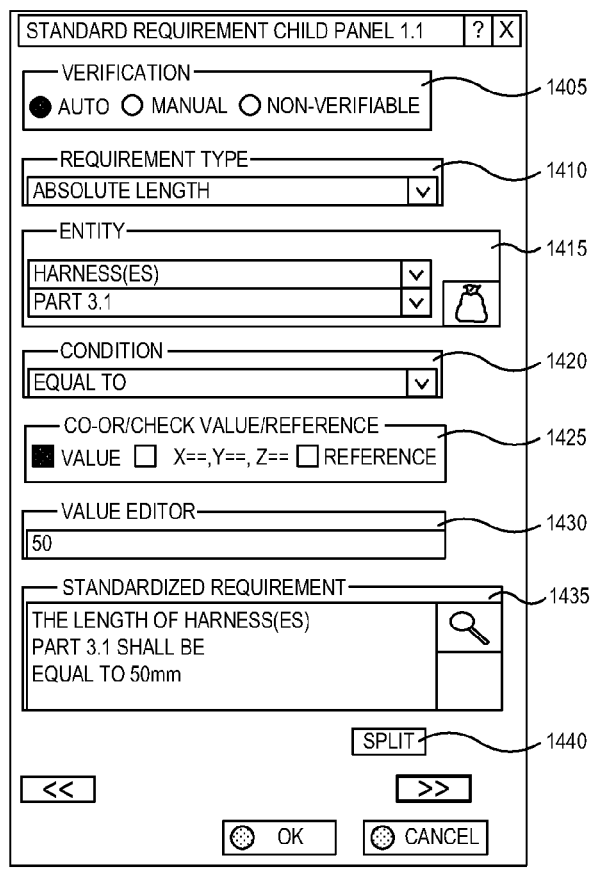
FIG. 14 illustrates a screenshot of a standard requirement child panel, with resulting standardized requirement of "length" compliance, according to an embodiment of the invention.
Figure 15:
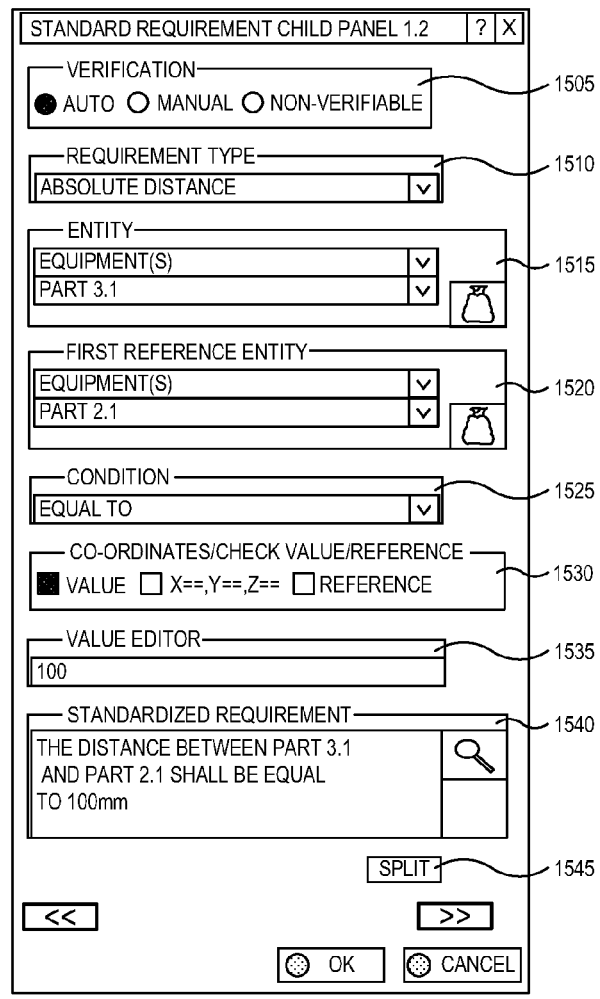
FIG. 15 illustrates a screenshot of a standard requirement child panel, with resulting standardized requirement of "distance" compliance, according to an embodiment of the invention.

FIG. 14 illustrates a screenshot of a standard requirement child panel 1400, with resulting standardized requirement of "length" compliance, according to an embodiment of the invention. It is appreciated that the standard requirement child panel 1400 is an exemplary embodiment of the standard requirement child panel 720 of FIG. 7. Particularly, FIG. 14 illustrates a first standard requirement child panel 1400 associated with a first split requirement associated with a desired requirement including multiple compliance criteria. A second standard requirement child panel and a third standard requirement child panel associated with a second split requirement and a third split requirement associated with the desired requirement including the multiple compliance criteria are illustrated in FIG. 15 and FIG. 16, respectively.

Referring to FIG. 14, the standard requirement child panel 1400 includes a verification field 1405, a requirement type field 1410, an entity field 1415, a condition field 1420, a coordinates/check value/reference field 1425, a value editor field 1430, a standardized requirement field 1435 and a split button 1440. The verification field 1405 indicates whether the desired requirement is automatically verifiable, manually verifiable or non-verifiable. In one embodiment, keywords present in the desired requirement are matched with a knowledgebase, which includes lexical and engineering domain dictionaries, to confirm the automatically verifiability of the desired requirement.

The requirement type field 1410 provides an option to select a requirement type (e.g., absolute length) from a set of requirement types (e.g., the set of requirement types 1305 of FIG. 13) based on a compliance criterion specified in the desired requirement. The entity field 1415 provides an option to select an entity type (e.g., harness(es)) from entity types (e.g., the entity types 1310 of FIG. 13) associated with the desired requirement. Also, the entity field 1415 enables the user to search and select one or more entities associated with the desired requirement. In one embodiment, the one or more entities are searched and selected using an entity search panel (e.g., the entity search panel 1200 of FIG. 12A) of the standardization and verification tool 230.

The condition field 1420 provides an option to select an evaluation condition (e.g., equal to) from evaluation conditions (e.g., the evaluation conditions 1315 of FIG. 13) associated with the desired requirement. The co-ordinates/check value/reference field 1425 facilitates selection of any one criterion (e.g., based on reference or verification value or co-ordinates) for verification. The value editor field 1430 allows the user to provide a verification value/reference/co-ordinates associated with the desired requirement.

The standardized requirement field 1435 displays a desired standardized requirement generated by the standardization and verification tool 230. The split button 1440 enables the user to launch another standard requirement child panel (e.g., as shown in FIGS. 15 and 16) if there are more than one splits required for the desired requirement.

In the example embodiment illustrated in FIG. 14, the verification field 1405 indicates that "auto" button is selected, which implies that the desired requirement is automatically verifiable. The requirement type field 1410 displays the requirement type as "absolute length". The entity field 1415 displays the entity type as "harness(es)" and the entity as "Part 3.1". The condition field 1420 displays the evaluation condition as "equal to". The co-ordinates/check value/reference field 1425 indicates that "value" button is selected. The value editor field 1430 displays the verification value as "50". Further, based on the above inputs, the standardized requirement field 1435 displays the desired standardized requirement as "the length of harness(es) Part 3.1 shall be equal to 50 mm".

FIG. 15 illustrates a screenshot of a standard requirement child panel 1500, with resulting standardized requirement of "distance" compliance, according to an embodiment of the invention. It is appreciated that the standard requirement child panel 1500 is an exemplary embodiment of the standard requirement child panel 720 of FIG. 7. Particularly, the standard requirement child panel 1500 includes a verification field 1505, a requirement type field 1510, an entity field 1515, a first reference entity field 1520, a condition field 1525, a co-ordinates/check value/reference field 1530, a value editor field 1535, a standardized requirement field 1540 and a split button 1545.

It should be noted that the standard requirement child panel 1500 is similar to the standard requirement child panel 1400 of FIG. 14, except the first reference entity field 1520 of the standard requirement child panel 1500, as the standard requirement child panel 1500 is associated with the desired requirement of "distance" compliance. The first reference entity field 1520 provides an option to select a first reference entity type (e.g., equipment(s)) from the entity types associated with the desired requirement. Also, the first reference entity field 1520 enables the user to search and select a first reference entity associated with the desired requirement.

In the example embodiment illustrated in FIG. 15, the verification field 1505 indicates that "auto" button is selected, which indicates that the desired requirement is automatically verifiable. The requirement type field 1510 displays the requirement type as "absolute distance". The entity field 1515 displays the entity type as "equipment(s)" and the entity as "Part 3.1". The first reference entity field 1520 displays the first reference entity type as "equipment(s)" and the first reference entity as "Part 2.1". The condition field 1525 displays the evaluation condition as "equal to". The co-ordinates/check value/reference field 1530 indicates that "value" button is selected. The value editor field 1535 displays the verification value as "100". Further, based on the above inputs, the standardized requirement field 1540 displays the desired standardized requirement as "the distance between Part 3.1 and Part 2.1 shall be equal to 100 mm".

FIG. 16 illustrates a screenshot of a standard requirement child panel 1600, with resulting standardized requirement of "position between" compliance, according to an embodiment of the invention. It is appreciated that the standard requirement child panel 1600 is an exemplary embodiment of the standard requirement child panel 720 of FIG. 7. Particularly, the standard requirement child panel 1600 includes a verification field 1605, a requirement type field 1610, an entity field 1615, a first reference entity field 1620, a second reference entity field 1625, a condition field 1630, a standardized requirement field 1635 and a split button 1640.

It can be seen from FIG. 16 that, the standard requirement child panel 1600 includes an additional field, i.e., the second reference entity field 1625, and does not include other fields, such as a co-ordinates/check value/reference field and a value editor field as compared to the standard requirement child panel 1500, since the standard requirement child panel 1600 is associated with the desired requirement of "position between" compliance.

Further, as the verification field 1605, the requirement type field 1610, the entity field 1615, the first reference entity field 1620, the condition field 1630, the standardized requirement field 1635 and the split button 1640 of the standard requirement child panel 1600 are similar to that of the verification field 1505, the requirement type field 1510, the entity field 1515, the first reference entity field 1520, the condition field 1525, the standardized requirement field 1540 and the split button 1545 of the standard requirement child panel 1500, respectively, the explanation thereof is omitted.

The second reference entity field 1625 provides an option to select a second reference entity type (e.g., equipment(s)) from the entity types associated with the desired requirement. Also, the second reference entity field 1625 enables the user to search and select a second reference entity associated with the desired requirement.

In the example embodiment illustrated in FIG. 16, the verification field 1605 indicates that "auto" button is selected, which implies that the desired requirement is automatically verifiable. The requirement type field 1610 displays the requirement type as "position". The entity field 1615 displays the entity type as "equipment(s)" and the entity as "Part 3.1". The first reference entity field 1620 displays the first reference entity type as "equipment(s)" and the first reference entity as "Part 2.1". The second reference entity field 1625 displays the second reference entity type as "equipment(s)" and the second reference entity as "Part 1.1". The condition field 1630 displays the evaluation condition as "between". Further, based on the above inputs, the standardized requirement field 1635 displays the desired standardized requirement as "the position of Part 3.1 shall be between Part 2.1 and Part 1.1".

FIG. 17 illustrates a screenshot of a verification report 1700 obtained using the standardization and verification tool 230, according to an embodiment of the invention. Particularly, the verification report 1700 includes a requirements document field 1705, a requirement ID field 1710, a requirement statement field 1715, a requirement type field 1720, an entities field 1725, a standardized requirement field 1730, a verification logic field 1735, a calculated values field 1740, an installation compliancy field 1745 and a proof of verification field 1750.

The requirements document field 1705 indicates a requirements document provided by the user as an input to the standardization and verification tool 230 for standardization of the desired requirement and verification of the desired standardized requirement. The requirement ID field 1710 indicates a requirement ID associated with a desired requirement in the requirements document. The requirement statement field 1715 displays a statement of the desired requirement associated with the requirement ID displayed in the requirement ID field 1710. The requirement type field 1720 displays a requirement type associated with the desired requirement. In one embodiment, the requirement type is selected from a set of requirement types (e.g., the set of requirement types 1305 of FIG. 13) based on a compliance criterion specified in the desired requirement.

The entities field 1725 displays entities associated with the desired requirement. The standardized requirement field 1730 displays a desired standardized requirement that is standardized (e.g., using the standardization and verification tool 230) based on the desired requirement provided by the user. The verification logic field 1735 displays verification logic that is derived based on the compliance criteria specified in the desired standardized requirement, for verifying the desired standardized requirement. The calculated values field 1740 displays values associated with relevant extracted and derived attributes (associated with one or more components associated with the desired standardized requirement) calculated for the verification of the desired standardized requirement.

The installation compliancy field 1745 indicates whether the relevant extracted and derived attributes of the one or more components substantially meet the compliance criteria specified in the desired standardized requirement or not. The proof of verification field 1750 displays a hyperlink which enables the user to access a proof of verification (e.g., a screenshot of a verification result) associated with the verification of the desired standardized requirement.

In the example embodiment illustrated in FIG. 17, the requirements document field 1705 displays the requirements documents provided by the user as "REQ 1" in the first row, and "REQ 2" in the second row of the requirements document field 1705 column. The requirement ID field 1710 displays the requirement ID associated with the desired requirement of the REQ 1 document as "requirement 1" in the first row and the requirement ID associated with the desired requirement of the REQ 2 document as "requirement 1" in the second row of the requirement ID field 1710 column. The requirement statement field 1715 displays the requirement statement associated with the requirement_1 of the REQ 1 document as "equipment 1 shall be located between equipment 3 and equipment 4" in the first row and the requirement statement associated with the requirement_1 of the REQ 2 document as "equipment 1 and equipment 2 shall be segregated by 2 m" in the second row of the requirement statement field 1715 column.

The requirement type field 1720 displays the requirement type associated with the requirement_1 of the REQ 1 document as "position" in the first row and the requirement type associated with the requirement_1 of the REQ 2 document as "absolute distance" in the second row of the requirement type field 1720 column. The entities field 1725 displays the entities associated with the requirement_1 of the REQ 1 document as "equipment 1", "equipment 3", and "equipment 4" in the first row and the entities associated with the requirement_1 of the REQ 2 document as "equipment 1" and "equipment 2" in the second row of the entities field 1725 column.

The standardized requirement field 1730 displays the desired standardized requirement associated with the requirement_1 of the REQ 1 document as "the position of equipment 1 shall be located between equipment 3 and equipment 4" in the first row and the standardized requirement associated with the requirement_1 of the REQ 2 document as "the distance between equipment 1 and equipment 2 shall be more than 2 m" in the second row of the standardized requirement field 1730 column. The verification logic field 1735 displays the verification logic for verifying the respective desired standardized requirement as "x(equipment 3)<x(equipment 1)<x (equipment 4)" in the first row and "d(equipment 1, equipment 2)>2 m" in the second row of the verification logic field 1735 column.

The calculated values field 1740 displays the calculated values associated with "equipment 3", "equipment 1" and "equipment 4" as "x(equipment 3)=2451 mm", "x(equipment 1)=2600 mm" and "x(equipment 4)=2724 mm" in the first row and the calculated values associated with "equipment 1" and "equipment 2" as "d(equipment 1, equipment 2)=2150 mm" in the second row of the measured values field 1740 column.

The installation compliancy field 1745 displays "OK" in the first row and "OK" in the second row of the installation compliancy field 1745 column, indicating that the verification of the desired standardized requirement associated with the REQ 1 document and the REQ 2 document, respectively is successful. The proof of verification field 1750 displays the hyperlinks "refer to proof 1" in the first row and "refer to proof 2" in the second row of the proof of verification field 1750 column. It is appreciated that the hyperlinks "refer to proof 1" and "refer to proof 2" enable the user to view of the verification results stored in the requirements database 220.

Figure 18:
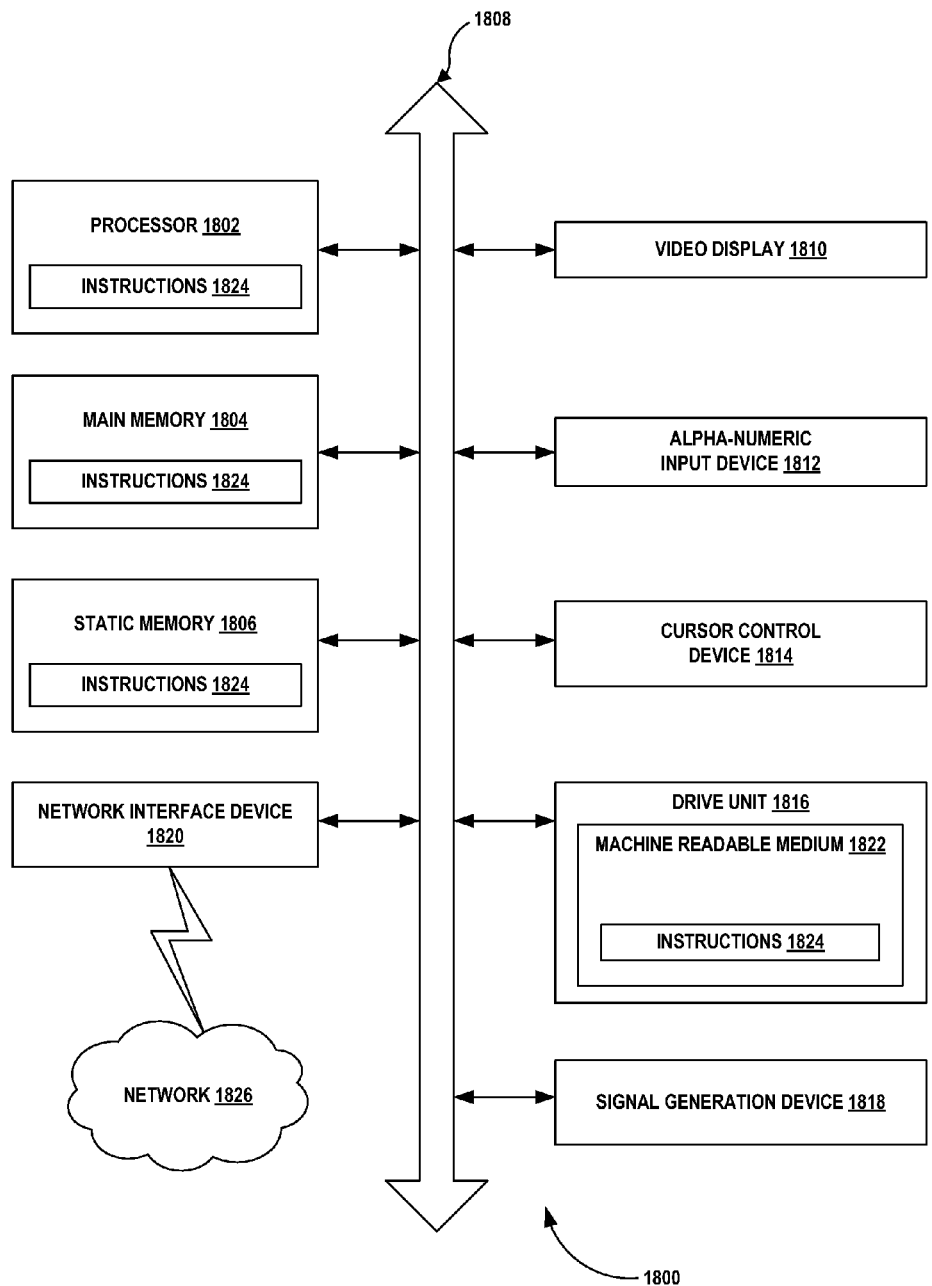
FIG. 18 illustrates a diagrammatic system view of a data processing system in which any of the embodiments disclosed herein may be performed, according to one embodiment.

FIG. 18 illustrates a diagrammatic system view 1800 of a data processing system in which any of the embodiments disclosed herein may be performed, according to one embodiment. Particularly, the diagrammatic system view of FIG. 18 illustrates a processor 1802, a main memory 1804, a static memory 1806, a bus 1808, a video display 1810, an alpha-numeric input device 1812, a cursor control device 1814, a drive unit 1816, a signal generation device 1818, a network interface device 1820, a machine readable medium 1822, instructions 1824 and a network 1826.

The diagrammatic system view 1800 may indicate a personal computer and/or a data processing system in which one or more operations disclosed herein are performed. The processor 1802 may be a microprocessor, a state machine, an application specific integrated circuit, a field programmable gate array, etc. The main memory 1804 may be a dynamic random access memory and/or a primary memory of a computer system. The static memory 1806 may be a hard drive, a flash drive, and/or other memory information associated with the data processing system.

The bus 1808 may be an inter-connection between various circuits and/or structures of the data processing system. The video display 1810 may provide graphical representation of information on the data processing system. The alpha-numeric input device 1812 may be a keypad, keyboard and/or any other input device of text (e.g., a special device to aid the physically handicapped). The cursor control device 1814 may be a pointing device such as a mouse. The drive unit 1816 may be a hard drive, a storage system, and/or other longer term storage subsystem.

The signal generation device 1818 may be a bios and/or a functional operating system of the data processing system. The network interface device 1820 may perform interface functions (e.g., code conversion, protocol conversion, and/or buffering) required for communications to and from the network 1826 between a number of independent devices (e.g., of varying protocols). The machine readable medium 1822 may provide instructions on which any of the methods disclosed herein may be performed. The instructions 1824 may provide source code and/or data code to the processor 1802 to enable any one or more operations disclosed herein.

For example, a storage medium having instructions, that when executed by a computing platform, result in execution for a method of automatic standardization and verification of system design requirements in a product development project using the standardization and verification tool 230 embedded in the CAD application 325, the method includes obtaining a desired standardized requirement (e.g., a legislative/regulatory requirement, a knowledgebase requirement, a customer requirement, etc.) from the requirements database 220 using the standardization and verification tool 230, retrieving compliance criteria from the desired standardized requirement using the standardization and verification tool 230, obtaining one or more components associated with the desired standardized requirement from the one or more data sources 225A-N using the standardization and verification tool 230, and obtaining relevant extracted and derived attributes from the one or more components, associated with the desired standardized requirement, using the standardization and verification tool 230.

Further, the storage medium may have instructions to compare the relevant extracted and derived attributes with the compliance criteria using the standardization and verification tool 230, determine whether the relevant extracted and derived attributes substantially meet the compliance criteria based on the outcome of the comparison using the standardization verification tool 230, and generate a verification report based on the determination using the standardization and verification tool 230.

In addition, the storage medium may have instructions to provide a desired requirement in the requirements database 220, validate the desired requirement for meeting the RBE guidelines using the standardization and verification tool 230, and validate whether the desired requirement can be used for an automatic verification in the CAD application 325. In one embodiment, the storage medium may have instructions to send the desired requirement back to the standardization and verification tool 230 for standardizing into one or more sub-requirements based on the compliance criteria if the validation fails. In another embodiment, the storage medium may have instructions to declare the desired requirement as desired standardized requirement and store the desired standardized requirement in the requirements database 220 using the standardization and verification tool 230 if the validation passes.

In an alternate embodiment, the storage medium may have instructions to determine whether the desired requirement can be verified using a simulation tool if the validation fails. If it is determined so, the storage medium may have instructions to use the simulation tool to verify the desired requirement by comparing simulation results with the compliance criteria associated with the desired requirement and to output a verification report. If it is determined not, the storage medium may have instructions to manually perform the verification and output a verification report.

Furthermore, the storage medium may have instructions to analyze existing requirements and create a set of requirement types, entity types and evaluation conditions based on the compliance criteria. Also, the storage medium may have instructions to determine whether the desired requirement includes multiple compliance criteria using the standardization and verification tool 230. If it is determined not, the storage medium may have instructions to set a number of splits to one using the standardization and verification tool 230. If it is determined so, the storage medium may have instructions to identify the number of splits required for the desired requirement and launch a standard requirement child panel using the standardization and verification tool 230.

Moreover, the storage medium may have instructions to select a requirement type from the set of requirement types based on a compliance criterion specified in the desired requirement using the standardization and verification tool 230, select one of the entity types associated with the desired requirement using the standardization and verification tool 230, search and select one or more entities associated with the desired requirement using the standardization and verification tool 230, select one of the evaluation conditions associated with the desired requirement using the standardization and verification tool 230 and provide at least one of a verification value and a reference associated with the desired requirement to arrive at the desired standardized requirement.

The above-described system and method significantly reduces human error in a system design requirements verification process. Further, the above-described technique reduces turnaround time for requirements verification, thereby improving concurrent engineering and quality of design. Furthermore, the above-described technique automates the requirements verification process in large product development projects and reduces the current manual intensive work required in completing the requirements verification process. Moreover, the above-described process standardizes the requirements based on the RBE guidelines in order to remove ambiguities present if any, and verifies the system design requirements automatically.

It is appreciated that, the above-described technique enables streamlining validation and verification of the requirements. Further, the above-described technique provides a robust and validated platform to allow an automatic verification of the requirements using any CAD application. The above-described standardization and verification tool speeds up convergence to a mature system design.

The above-described standardization and verification tool can be embedded in almost any CAD application. Typically, any CAD application first recognizes the beginning of any and all changes taking place in a product design environment, i.e., the requirements are generally kept in sync with any changes in the product development environment, and therefore the standardization and verification tool is ideally suited to be embedded in any CAD application. Even though, the input requirement for the standardization and verification tool is described with reference to using an XML format, one can envision that any other format can be used for these purposes.

In addition, the above-described technique automatically processes the requirement to confirm whether the requirement can be automatically verified or requires any manual intervention. If the requirement can be automatically verified, then the standardization and verification tool permits a user to interpret the requirement in order to identify the concerned components for a given requirement and to standardize the requirement in accordance with the RBE guidelines.

The above-described standardization and verification tool also enables extraction of the data required for verification and automatically generates any mathematical logic needed for verification from the standardized requirement. Furthermore, the standardization and verification tool outputs results on any 3D CAD platform as well as stores the outputted result in an XML format or any other format in an external database.

Also, the method may be in a form of a machine-readable medium embodying a set of instructions that, when executed by a machine, cause the machine to perform any method disclosed herein. It will be appreciated that the various embodiments discussed herein may not be the same embodiment, and may be grouped into various other embodiments not explicitly disclosed herein.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method for automatic standardization and verification of system design requirements in a product development project using a standardization and verification tool embedded in a computer aided design (CAD) application, comprising:
    obtaining a desired standardized requirement from a requirements database using the standardization and verification tool, wherein the desired standardized requirement is generated by;
        providing a desired requirement in the requirements database, wherein the desired requirement is written according to requirement based engineering (RBE) guidelines;
        validating whether the desired requirement is used for an automatic verification in the CAD application;
        if the desired requirement is not used for an automatic verification, sending the desired requirement back to the standardization and verification tool for standardizing into one or more sub-requirements based on the compliance criteria; and
        if the desired requirement is used for an automatic verification, declaring the desired requirement as the desired standardized requirement and storing the desired standardized requirement in the requirements database using the standardization and verification tool:
    retrieving compliance criteria from the standardized requirement using the standardization and verification tool;
    obtaining one or more components associated with the standardized requirement from one or more data sources using the standardization and verification tool;
    obtaining relevant extracted and derived attributes from the one or more components, associated with the standardized requirement, using the standardization and verification tool;

determining whether the relevant extracted and derived attributes meet the compliance criteria using the standardization and verification tool; and generating a verification report including a proof of verification associated with verification of the desired standard requirement based on the determination using the standardization and verification tool.

2. The method of claim 1, wherein the desired standardized requirement is selected from the group consisting of legislative/regulatory requirement, knowledgebase requirement, and customer requirement.

3. The method of claim 2, wherein the legislative regulatory requirement comprises a requirement received from one or more different legislative regulatory authorities.

4. The method of claim 1, further comprising:
if the desired requirement is not used for an automatic verification, determining whether the desired requirement is verified using a simulation tool;
if so, using the simulation tool to verify the desired requirement by comparing simulation results with the compliance criteria associated with the desired requirement and to output a verification report; and
if not, manually performing the verification and outputting a verification report.

5. The method of claim 1, further comprising analyzing existing requirements and creating a set of requirement types, entity types and evaluation conditions based on the compliance criteria.

6. The method of claim 5, further comprising:
determining whether the desired requirement includes multiple compliance criteria for setting a number of splits using the standardization and verification tool;
if not, setting the number of splits to one using the standardization and verification tool:
if so, identifying the number of splits required for the desired requirement based on the multiple compliance criteria and launching a. standard requirement child panel: using the standardization and verification tool;
selecting one requirement type from the set of requirement types based on a compliance criterion specified in the desired requirement using the standardization and verification tool;
selecting one of the entity types associated with the desired requirement using the standardization and verification tool;
searching and selecting one or more entities associated with the desired requirement using the standardization and verification tool:
selecting one of the evaluation conditions associated with the desired requirement using the standardization and verification tool;
providing at least one of a verification value and a reference associated with the desired requirement to arrive at the desired standardized requirement using the standardization and verification tool.

7. The method of claim 6, wherein the set of requirement types associated with the desired requirement is selected from the group consisting of absolute length, absolute distance, relative length, absolute diameter, position, and relative diameter.

8. The method of claim 6, wherein the entity types associated with the desired requirement is selected from the group consisting of equipment, system, harness, route, and pipe.

9. The method of claim 6, wherein the evaluation conditions associated with the desired requirement is selected from the group consisting of equal to, at most, between, and at least.

10. The method of claim 6, wherein the determining whether the relevant extracted and derived attributes meet the compliance criteria based on the outcome of the comparison using the standardization and verification tool comprises determining whether the relevant extracted and derived attributes from each split requirement meet the compliance criteria based on the outcome of the comparison using the standardization and verification tool.

11. The method of claim 6, wherein the searching and selecting one or more entities associated with the desired requirement using the standardization and verification tool comprises:
searching and selecting based on function and geometry based attributes associated with the one or more entities associated with the desired requirement using the standardization and verification tool.

12. An article, comprising:
a non-transitory computer-readable storage medium having instructions, that when executed by a computing platform, result in execution of a method for automatic standardization and verification of system design requirements in a product development project using a standardization and verification tool embedded in a computer aided design (CAD) application, comprising:
obtaining a desired standardized requirement from a requirements database using the standardization and verification tool, wherein the desired standardized requirement is generated by;
providing a desired requirement in the requirements database, wherein the desired requirement is written according to requirement based engineering (RBE) guidelines;
validating whether the desired requirement is used for an automatic verification in the CAD application;
if the desired requirement is not used for an automatic verification, sending the desired requirement back to the standardization and verification tool for standardizing into one or more sub-requirements based on the compliance criteria; and
if the desired requirement is used for an automatic verification, declaring the desired requirement as the desired standardized requirement and storing the desired standardized requirement in the requirements database using the standardization and verification tool:
retrieving compliance criteria from the standardized requirement using the standardization and verification tool;
obtaining one or more components associated with the standardized requirement from one or more data sources using the standardization and verification tool;
obtaining relevant extracted and derived attributes from the one or more components, associated with the standardized requirement, using the standardization and verification tool;
determining whether the relevant extracted and derived attributes meet the compliance criteria using the standardization verification tool; and
generating a verification report including a proof of verification associated with verification of the desired standard requirement based on the determination using the standardization and verification tool.

13. The article of claim 12, wherein the desired standardized requirement is selected from the group consisting of legislative/regulatory requirement, knowledgebase requirement, and customer requirement.

14. The article of claim 12, further comprising:
if the desired requirement is not used for an automatic verification, determining whether the desired requirement is verified using a simulation tool;
if so, using the simulation tool to verify the desired requirement by comparing simulation results with the compliance criteria associated with the desired requirement and to output a verification report; and
if not manually performing the verification and outputting a verification report.

15. The article of claim 12, further comprising analyzing existing requirements and creating a set of requirement types, entity types and evaluation conditions based on the compliance criteria.

16. The article of claim 15, further comprising:
determining whether the desired requirement includes multiple compliance criteria for setting a number of splits using the standardization and verification tool;
if not, setting the number of splits to one using the standardization and verification tool;
if so, identifying the number of splits required for the desired requirement based on the multiple compliance criteria and launching a standard requirement child panel using the standardization and verification tool;
selecting one requirement type from the set of requirement types based on a compliance criterion specified in the desired requirement using the standardization and verification tool;
selecting one of the entity types associated with the desired requirement using the standardization and verification tool;
searching and selecting one or more entities associated with the desired requirement using the standardization and verification tool;
selecting one of the evaluation conditions associated with the desired requirement using the standardization and verification tool;
providing at least one of a verification value and a reference associated with the desired requirement to arrive at the desired standardized requirement.

17. A system for automatic standardization and verification of system design requirements in a product development project, comprising:
one or more server devices comprising:
a requirements database; and
one or more data sources: and
one or more client devices comprising a standardization and verification tool embedded in a computer aided design (CAD) application configured to receive requirement information and component information from the requirements database and the one or more data sources, respectively, wherein the standardization and verification tool comprises a standard requirement main panel that is configured to provide a desired requirement in the requirements database, wherein the desired requirement is written according to requirement based engineering (RBE) guidelines, wherein standardization and verification tool validates whether the desired requirement is used for an automatic verification in the CAD application, wherein the standardization and verification tool sends the desired requirement back for standardizing into one or more sub-requirements based on the compliance criteria if the desired requirement is not used for an automatic verification, and wherein the standardization and verification tool declares the desired requirement as the desired standardized requirement and stores the desired standardized requirement in the requirements database if the desired requirement is used for an automatic verification, wherein the standardization and verification tool is configured to obtain the desired standardized requirement from the requirements database, wherein the standardization and verification tool retrieves compliance criteria from the desired standardized requirement, wherein the standardization and verification tool obtains one or more components associated with the standardized requirement from the one or more data sources, wherein the standardization and verification tool obtains relevant extracted and derived attributes from the one or more components associated with the standardized requirement, wherein the standardization and verification tool determines whether the relevant extracted and derived attributes meet the compliance criteria, and wherein the standardization and verification tool generates a verification report including a proof of verification associated with verification of the desired standard requirement based on the determination.

18. The system of claim 17, wherein the desired standardized requirement is selected from the group consisting of legislative/regulatory requirement, knowledgebase requirement, and customer requirement.

19. The system of claim 17, wherein the standardization and verification tool is configured to determine whether the desired requirement is verified using a simulation tool if the desired requirement is not used for an automatic verification, wherein the standardization and verification tool is configured to use the simulation tool to verify the desired requirement by comparing simulation results with the compliance criteria associated with the desired requirement and to output a verification report if the desired requirement is verified using the simulation tool, and wherein the standardization and verification tool is further configured to perform a manual verification and output a verification report if the desired requirement cannot be verified using the simulation tool.

20. The system of claim 19, wherein the standardization and verification tool analyzes existing requirements and creates a set of requirement types, entity types, and evaluation conditions based on the compliance criteria.

21. The system of claim 19, wherein the standardization and verification tool determines whether the desired requirement includes multiple compliance criteria for setting a number of splits, wherein the standardization and verification tool sets the number of splits to one in the standard requirement main panel if there are no multiple compliance criteria, wherein the standardization and verification tool identifies the number of splits required for the desired requirement based on the multiple compliance criteria and launches a standard requirement child panel if there are multiple compliance criteria, wherein the standardization and verification tool selects one requirement type from the set of requirement types based a compliance criterion specified in the desired requirement, wherein the standardization and verification tool selects one of the entity types associated with the desired requirement, wherein the standardization and verification tool searches and selects one or more entities associated with the desired requirement, wherein the standardization and verification tool selects one of the evaluation conditions associated with the desired requirement, and wherein the standardization and verification tool provides at least one of a verification value and a reference associated with the desired requirement to arrive at the desired standardized requirement.

* * * * *